United States Patent
Chen et al.

(10) Patent No.: US 8,934,277 B2
(45) Date of Patent: Jan. 13, 2015

(54) SEMICONDUCTOR SYSTEM WITH AT LEAST ONE THREE-LEVEL ELECTRIC POWER INVERTER CIRCUIT

(71) Applicant: Fuji Electric Co., Ltd., Kawasaki-shi (JP)

(72) Inventors: Shuangching Chen, Nagano (JP); Hiroaki Ichikawa, Nagano (JP)

(73) Assignee: Fuji Electric Co., Ltd. (JP)

(*) Notice: Subject to any disclaimer, the term of this patent is extended or adjusted under 35 U.S.C. 154(b) by 0 days.

(21) Appl. No.: 14/157,025

(22) Filed: Jan. 16, 2014

(65) Prior Publication Data
US 2014/0218991 A1 Aug. 7, 2014

(30) Foreign Application Priority Data

Feb. 6, 2013 (JP) .................................. 2013-021848

(51) Int. Cl.
*H02M 7/5387* (2007.01)
*H02M 1/00* (2006.01)
*H02M 7/537* (2006.01)
*H01L 23/36* (2006.01)
(Continued)

(52) U.S. Cl.
CPC ............... *H02M 7/537* (2013.01); *H01L 23/36* (2013.01); *H01L 25/072* (2013.01); *H02M 7/003* (2013.01); *H01L 2224/48137* (2013.01); *H01L 2224/49175* (2013.01); *H01L 2924/19107* (2013.01)
USPC .......................................... 363/132; 363/144

(58) Field of Classification Search
USPC ........... 363/50, 55–57, 95–98, 126–132, 140, 363/144; 257/700–703, 723–725
See application file for complete search history.

(56) References Cited

U.S. PATENT DOCUMENTS 5,459,655 A * 10/1995 Mori et al. ..................... 363/132
5,544,038 A * 8/1996 Fisher et al. ................... 363/147
(Continued)

FOREIGN PATENT DOCUMENTS

JP 2002-368192 A 12/2002
JP 2008-193779 A 8/2008
(Continued)

OTHER PUBLICATIONS

Extended European Search Report for corresponding EP 14151039.6, mail date May 26, 2014.

*Primary Examiner* — Timothy J Dole
*Assistant Examiner* — Yusef Ahmed
(74) *Attorney, Agent, or Firm* — Rossi, Kimms & McDowell LLP

(57) ABSTRACT

In some aspects of the invention, multiple insulating substrates each mounting thereon at least one each of at least four semiconductor devices that form at least one of three-level electric power inverter circuits and a base plate on the one surface of which a plurality of the insulating plates are arranged are provided. On the one surface of the base plate, at least four regions are established and multiple insulating substrates are arranged to be distributed so that at least one each of the at least four semiconductor devices is arranged in each of the four regions established on the base plate. This can make the semiconductor devices arranged to be distributed so that heat generating sections determined according to the operation mode of the semiconductor system comes to be partial to disperse generated heat, by which a semiconductor system is provided which can enhance heat dispersion efficiency.

7 Claims, 23 Drawing Sheets

(51) Int. Cl.
*H01L 25/07* (2006.01)
*H02M 7/00* (2006.01)

(56) References Cited

U.S. PATENT DOCUMENTS

| | | | | |
|---|---|---|---|---|
| 5,731,970 A | * | 3/1998 | Mori et al. | 363/132 |
| 5,929,519 A | * | 7/1999 | Mori et al. | 257/724 |
| 6,278,179 B1 | * | 8/2001 | Mermet-Guyennet | 257/686 |
| 6,456,516 B1 | * | 9/2002 | Bruckmann et al. | 363/144 |
| 6,563,211 B2 | * | 5/2003 | Fukada et al. | 257/706 |
| 6,818,969 B2 | * | 11/2004 | Asano et al. | 257/666 |
| 6,843,335 B2 | * | 1/2005 | Shirakawa et al. | 180/65.1 |
| 6,867,560 B2 | * | 3/2005 | Arimitsu | 318/144 |
| 7,227,259 B2 | * | 6/2007 | Heilbronner et al. | 257/724 |
| 7,589,400 B2 | * | 9/2009 | Hozoji et al. | 257/673 |
| 7,973,405 B2 | * | 7/2011 | Takahashi et al. | 257/724 |
| 8,461,623 B2 | * | 6/2013 | Nakata | 257/146 |
| 8,462,531 B2 | * | 6/2013 | Nishikimi et al. | 363/144 |
| 2003/0151137 A1 | * | 8/2003 | Asano et al. | 257/724 |
| 2004/0056349 A1 | * | 3/2004 | Yamada et al. | 257/724 |
| 2006/0274561 A1 | * | 12/2006 | Ahmed et al. | 363/132 |
| 2008/0291628 A1 | * | 11/2008 | Aoki et al. | 361/699 |
| 2008/0291710 A1 | * | 11/2008 | Aoki et al. | 363/131 |
| 2009/0237904 A1 | * | 9/2009 | Onishi et al. | 361/782 |
| 2009/0290398 A1 | * | 11/2009 | Kanie et al. | 363/132 |
| 2010/0039843 A1 | * | 2/2010 | Takizawa | 363/131 |
| 2011/0222325 A1 | | 9/2011 | Komatsu | |
| 2012/0119256 A1 | * | 5/2012 | Okita | 257/140 |
| 2012/0286292 A1 | * | 11/2012 | Nakayama et al. | 257/77 |
| 2013/0169035 A1 | * | 7/2013 | Nakashima | 307/9.1 |

FOREIGN PATENT DOCUMENTS

| | | |
|---|---|---|
| JP | 2011-193646 A | 9/2011 |
| JP | 2011-254672 A | 12/2011 |
| JP | 2012-110095 A | 6/2012 |

* cited by examiner

| | (a) | | | | | |
|---|---|---|---|---|---|---|
| T1:IGBT SWITCHING | T3 | T3 | T3 | T4 | T4 | T4 |
| T4:RB-IGBT RECOVER | T2 | T2 | T2 | T1 | T1 | T1 |

| | (b) | | | | | |
|---|---|---|---|---|---|---|
| T2:IGBT SWITCHING | T3 | T3 | T3 | T4 | T4 | T4 |
| T3:RG-IGBT RECOVER | T2 | T2 | T2 | T1 | T1 | T1 |

| | (c) | | | | | |
|---|---|---|---|---|---|---|
| T3:RB-IGBT SWITCHING | T3 | T3 | T3 | T4 | T4 | T4 |
| T1:FWD RECOVER | T2 | T2 | T2 | T1 | T1 | T1 |

| | (d) | | | | | |
|---|---|---|---|---|---|---|
| T4:RG-IGBT SWITCHING | T3 | T3 | T3 | T4 | T4 | T4 |
| T2:FWD RECOVER | T2 | T2 | T2 | T1 | T1 | T1 |

|  | (a) | | | | | |
|---|---|---|---|---|---|---|
| T1:IGBT SWITCHING | T2 | T2 | T2 | T3 | T3 | T3 |
| T4:RB-IGBT RECOVER | T4 | T4 | T4 | T1 | T1 | T1 |

|  | (b) | | | | | |
|---|---|---|---|---|---|---|
| T2:IGBT SWITCHING | T2 | T2 | T2 | T3 | T3 | T3 |
| T3:RB-IGBT RECOVER | T4 | T4 | T4 | T1 | T1 | T1 |

|  | (c) | | | | | |
|---|---|---|---|---|---|---|
| T3:RB-IGBT SWITCHING | T2 | T2 | T2 | T3 | T3 | T3 |
| T1:FWD RECOVER | T4 | T4 | T4 | T1 | T1 | T1 |

|  | (d) | | | | | |
|---|---|---|---|---|---|---|
| T4:RB-IGBT SWITCHING | T2 | T2 | T2 | T3 | T3 | T3 |
| T2:FWD RECOVER | T4 | T4 | T4 | T1 | T1 | T1 |

| T1:IGBT SWITCHING | T2 | T2 | T2 | T4 | T4 | T4 |
|---|---|---|---|---|---|---|
| T4:RB-IGBT RECOVER | T3 | T3 | T3 | T1 | T1 | T1 |

(b)

| T2:IGBT SWITCHING | T2 | T2 | T2 | T4 | T4 | T4 |
|---|---|---|---|---|---|---|
| T3:RB-IGBT RECOVER | T3 | T3 | T3 | T1 | T1 | T1 |

(c)

| T3:RB-IGBT SWITCHING | T2 | T2 | T2 | T4 | T4 | T4 |
|---|---|---|---|---|---|---|
| T1:FWD RECOVER | T3 | T3 | T3 | T1 | T1 | T1 |

(d)

| T4:RB-IGBT SWITCHING | T2 | T2 | T2 | T4 | T4 | T4 |
|---|---|---|---|---|---|---|
| T2:FWD RECOVER | T3 | T3 | T3 | T1 | T1 | T1 |

| T1:IGBT SWITCHING | T2 | T3 | T2 | T3 | T2 | T3 |
| T4:RB-IGBT RECOVER | T4 | T1 | T4 | T1 | T4 | T1 |

(b)

| T2:IGBT SWITCHING | T2 | T3 | T2 | T3 | T2 | T3 |
| T3:RB-IGBT RECOVER | T4 | T1 | T4 | T1 | T4 | T1 |

(c)

| T3:RB-IGBT SWITCHING | T2 | T3 | T2 | T3 | T2 | T3 |
| T1:FWD RECOVER | T4 | T1 | T4 | T1 | T4 | T1 |

(d)

| T4:RB-IGBT SWITCHING | T2 | T3 | T2 | T3 | T2 | T3 |
| T2:FWD RECOVER | T4 | T1 | T4 | T1 | T4 | T1 |

FIG.24

SEMICONDUCTOR SYSTEM WITH AT LEAST ONE THREE-LEVEL ELECTRIC POWER INVERTER CIRCUIT

BACKGROUND OF INVENTION

1. Field of the Invention

Embodiments of the invention relate to semiconductor systems containing power devices for being used for systems such as electric power inverters.

2. Related Art

Electric power inverters are widely used for systems such as a PCS (Power Conditioning Subsystem) and a UPS (Uninterruptible Power Supply) each provided with a function of converting electric power generated by an electric power generation unit such as a solar cell, a fuel cell or a gasoline engine to system electric power.

In such an electric power inverter, a semiconductor module is used in which power devices such as IGBTs (Insulated Gate Bipolar Transistors) and FWDs (Free Wheeling Diodes) are surface mounted on an insulating substrate to be contained in a resin case.

As an example of a semiconductor module used for an electric power inverter of such kind, the power semiconductor module proposed in Japanese Patent Application Publication No. JP-A-2012-110095 (referred to herein as "JP-A-2012-110095") is proposed, for example.

The power semiconductor module contains in a case a circuit of a three-level inverter in one phase. In the three-level inverter circuit, a U terminal and M terminal, in each of which a current flows in the direction opposite to the direction of the other, are wired so that they are arranged with one being laid over the other in close proximity thereto to thereby reduce inductance in the case.

Moreover, as another example of a related module, the power semiconductor module described in Japanese Patent Application Publication No. JP-A-2011-254672 (referred to herein as "JP-A-2011-254672") is proposed. In the power semiconductor module, when forming a three-level inverter like the three-level inverter described in JP-A-2012-110095, the external terminals of P, M, N and U thereof are arranged in a straight line with the M terminal made to be formed of two terminals M1 and M2 so as to be in the order of M1, P, N, M2 and U or in the order of M1, N, P, M2 and U. The configuration prevents a jumping up voltage from becoming large which is produced by the influence of wiring inductance when the operation mode is changed from the three-level mode to the two-level mode.

Further, as further another example of a related module, the semiconductor module described in Japanese Patent Application Publication No. JP-A-2008-193779 (referred to herein as "JP-A-2008-193779") is proposed. The semiconductor module, by containing in one package a series connection circuit of IGBTs, connected between the P terminal and the N terminal of the DC power supply, and an AC switching device, connected between the connection point of the series connection circuit and the neutral point of the DC power supply, is provided so as to actualize reduction in wiring inductance and reduction in the price of the system. Here, as the cases of forming a three-level inverter, there are described the case of providing a bidirectional switch by connecting two IGBTs in series each with a diode connected in inverse parallel thereto and the case of providing a bidirectional switch by connecting two reverse blocking IGBTs in inverse parallel. The reverse blocking IGBT is an IGBT having a reverse voltage withstand characteristic.

In addition, as still another example of a related module, the semiconductor system described in Japanese Patent Application Publication No. JP-A-2011-193646 (referred to herein as "JP-A-2011-193646") is proposed. The semiconductor system is provided with a series connection circuit of IGBTs, which is connected between the P terminal and the N terminal of the DC power supply of a three-level inverter circuit, and an intermediate terminal provided at the connection point of a first and second IGBTs, which are connected in series between the connection point of the series connection circuit and the neutral point of the DC power supply each having a diode connected in inverse parallel thereto. By the configuration, an insulation test can be carried out while preventing breakage of the IGBTs and diodes in the semiconductor system.

Furthermore, as still further another example of a related module, the semiconductor system described in Japanese Patent Application Publication No. JP-A-2002-368192 (referred to herein as "JP-A-2002-368192") is proposed. The semiconductor system is a large capacity semiconductor system used for a system such as an inverter in which three IGBT chips are provided on an insulating substrate so as to be arranged in a zigzag pattern so as to be connected in parallel to one another.

Incidentally, with respect to each of the examples of the related semiconductor modules described in JP-A-2012-110095, JP-A-2011-254672 and JP-A-2008-193779, although there is a disclosure of reducing the inductance therein, no consideration is found with respect to the heat generation in the semiconductor system.

Moreover, with respect to the example of the related semiconductor system described in JP-A-2011-193646, there is only a disclosure of the configuration of the three-level inverter circuit and no consideration is found with respect to the heat generation in the semiconductor system.

In JP-A-2002-368192, however, it is described that by arranging the semiconductor chips in a zigzag pattern, the heat generated in the semiconductor chips is efficiently dispersed to reduce interference by heat. In the example of the related semiconductor system described in JP-A-2002-368192, however, although generated heat can be dispersed to be uniformly distributed by arranging the semiconductor chips in a zigzag pattern, the heat is to be generated on the whole surface of the semiconductor system. This causes an unsolved problem of enabling no generated heat to be effectively dispersed.

SUMMARY OF THE INVENTION

Accordingly, embodiments of the invention address these and other unsolved problems.

In one aspect of the invention, a first form of a semiconductor device according to the invention includes a first semiconductor device, a second semiconductor device, a third semiconductor device and a fourth semiconductor device which devices are at least four devices forming at least one of three-level electric power inverter circuits, a plurality of insulating substrates on each of which at least one each of the first semiconductor device to the fourth semiconductor devices is mounted and a base plate on the surface of which a plurality of the insulating substrates are arranged. The surface of the base plate on which a plurality of the insulating substrates are arranged has four regions established into which the surface is divided in grid-like, and a plurality of the insulating substrates are arranged so that at least one each of the first semiconductor devices to the fourth semiconductor devices is arranged in each of the four regions to thereby disperse heat generated in the first to fourth semiconductor devices.

A second form of the semiconductor device according to an embodiment of the invention is a device in which a plurality of the insulating substrates include at least one of first insulating substrates that mounts two of the first to fourth semiconductor devices and at least one of second insulating substrates that mounts the rest two of the first to fourth semiconductor devices, and the at least one of the first insulating substrates and the at least one of the second insulating substrates are arranged so that at least one of the respective ones of the first to fourth semiconductor devices is arranged in each of the four regions.

A third form of the semiconductor device according to an embodiment of the invention in which of the four regions, in each of two regions positioned diagonally from each other, at least one semiconductor device is arranged that generates heat with the same timing as that of the other.

A fourth form of the semiconductor device according to an embodiment of the invention is a device in which of the four regions, in each of two regions adjacent to each other, at least one semiconductor device is arranged that generates heat with the same timing as that of the other.

A fifth form of the semiconductor device according to an embodiment of the invention is a device in which the three-level electric power inverter circuit formed on a plurality of the insulating substrates arranged on the surface of the base plate includes a first insulated gate bipolar transistor as the first semiconductor device the collector of which is connected to a positive side potential of a direct current circuit, a second insulated gate bipolar transistor as the second semiconductor device the emitter of which is connected to a negative side potential of the direct current circuit and the collector of which is connected to the emitter of the first insulated gate bipolar transistor, a bidirectional switching device one end of which is connected to the connection point of the emitter of the first insulated gate bipolar transistor and the collector of the second insulated gate bipolar transistor, a first external connection terminal connected to the collector of the first insulated gate bipolar transistor for connecting the collector to the positive side electric potential of the direct current circuit, a second external connection terminal connected to the other end of the bidirectional switching device, a third external connection terminal connected to the second external connection terminal to be at the same potential as the potential thereof, a fourth external connection terminal connected to the emitter of the second insulated gate bipolar transistor for connecting the emitter to the negative side electric potential of the direct current circuit, and a fifth external connection terminal connected to the connection point of the emitter of the first insulated gate bipolar transistor and the collector of the second insulated gate bipolar transistor.

A sixth form of the semiconductor device according to an embodiment of the invention is a device in which the bidirectional switching device is formed of two reverse blocking insulated gate bipolar transistors as the third and fourth semiconductor devices connected in inverse parallel to each other.

A seventh form of the semiconductor device according to en embodiment of the invention is a device in which the three-level electric power inverter circuit formed on a plurality of the insulating substrates arranged on the surface of the base plate includes a first insulated gate bipolar transistor as the first semiconductor device the collector of which is connected to a positive side potential of a direct current circuit, a second insulated gate bipolar transistor as the second semiconductor device the emitter of which is connected to an negative side potential of the direct current circuit, a third insulated gate bipolar transistor as the third semiconductor device the emitter of which is connected to the collector of the second insulated gate bipolar transistor, a fourth insulated gate bipolar transistor as the fourth semiconductor device the collector of which is connected to the emitter of the first insulated gate bipolar transistor and the emitter of which is connected to the collector of the third insulated gate bipolar transistor, a series connection of a first diode and a second diode the anode side of which connection is connected to the connection point of the collector of the second insulated gate bipolar transistor and the emitter of the third insulated gate bipolar transistor and the cathode side of which connection is connected to the connection point of the emitter of the first insulated gate bipolar transistor and the collector of the fourth insulated gate bipolar transistor, a first external connection terminal connected to the collector of the first insulated gate bipolar transistor for connecting the collector to the positive side electric potential of the direct current circuit, a second external connection terminal connected to the connection point of the first and second diodes, a third external connection terminal connected to the second external connection terminal to be at the same potential as the potential thereof, a fourth external connection terminal connected to the emitter of the second insulated gate bipolar transistor for connecting the emitter to the negative side electric potential of the direct current circuit and a fifth external connection terminal connected to the connection point of the emitter of the fourth insulated gate bipolar transistor and the collector of the third insulated gate bipolar transistor.

An eighth form of the semiconductor device according to an embodiment of the invention is a device in which the three-level electric power inverter circuit formed on a plurality of the insulating substrates arranged on the surface of the base plate further includes a case of a mold of resin covering the base plate from which case the first external connection terminal, second external connection terminal, third external connection terminal, fourth external connection terminal and fifth external connection terminal are drawn out while being arranged in a straight line in the longitudinal direction, and the case includes a pair of auxiliary terminals for the gate and emitter, respectively, of the first insulated gate bipolar transistor arranged on one of the opposing two sides of the case with the first to the fifth external connection terminals arranged in a straight line put in between, a pair of auxiliary terminals for the gate and emitter, respectively, of the second insulated gate bipolar transistor arranged on the one of the opposing two sides, a pair of auxiliary terminals for the gate and emitter, respectively, of the third insulated gate bipolar transistor arranged on the other one of the opposing two sides, and a pair of auxiliary terminals for the gate and emitter, respectively, of the fourth insulated gate bipolar transistor arranged on the other one of the opposing two sides. A pair of the auxiliary terminals for the gate and emitter of the third insulated gate bipolar transistor and a pair of the auxiliary terminals for the gate and emitter of the fourth insulated gate bipolar transistor are arranged at specified positions regardless of the connections and the arrangements of the semiconductor devices of the three-level electric power inverter circuits.

A ninth form of the semiconductor device according to an embodiment of the invention is a device in which the case has a plurality of auxiliary terminal holes arranged at a plurality of positions so that a pair of the auxiliary terminals for the gate and emitter of the first insulated gate bipolar transistor to a pair of the auxiliary terminals for the gate and emitter of the second insulated gate bipolar transistor are drawn out from the case while being chosen according to the connections and the arrangements of the semiconductor devices of the three-level electric power inverter circuits.

According to an embodiment of the invention, each of a plurality of the insulating substrates mounts thereon at least one each of at least four semiconductor devices that form at least one of three-level electric power inverter circuits and a plurality of the insulating substrates being arranged to be distributed so that at least one each of the at least four semiconductor devices is arranged in each of the four regions established on the base plate. This makes the semiconductor devices arranged to be distributed so that heat generating sections determined according to the operation mode of the semiconductor system comes to be partial to disperse generated heat, by which heat dispersion efficiency can be enhanced to enable the semiconductor system to be reliably prevented from being brought into an overheated state.

According to an embodiment of the invention, each of a plurality of the insulating substrates mounts thereon at least one each of at least four semiconductor devices that form at least one of three-level electric power inverter circuits and at least one each of a plurality of the insulating substrates is arranged while being distributed into each of at least four regions established on the base plate. This makes the semiconductor devices arranged so that heat generating sections according to the operation mode of the semiconductor system comes to be partial to disperse generated heat, by which heat dispersion efficiency can be enhanced to enable the semiconductor system to be reliably prevented from being brought into an overheated state.

BRIEF DESCRIPTION OF THE DRAWINGS

FIG. 11 is a view illustrating states of heat generation of the semiconductor devices for each operation mode of the semiconductor system according to the second embodiment of the invention with the states being simplified;

FIG. 18 is a view illustrating states of heat generation of the semiconductor devices for each operation mode of the semiconductor system according to the third embodiment of the invention with the states being simplified;

FIG. 20 is a view illustrating states of heat generation of the semiconductor devices for each operation mode in the example of the modification of the semiconductor system according to the third embodiment of the invention with the states being simplified;

FIG. 24 is a view illustrating states of heat generation of the semiconductor devices for each operation mode in the example of the modification of the semiconductor system according to the fourth embodiment of the invention with the states being simplified;

DETAILED DESCRIPTION

In the following, embodiments of the invention will be explained with reference to the attached drawings.

Figure 1:
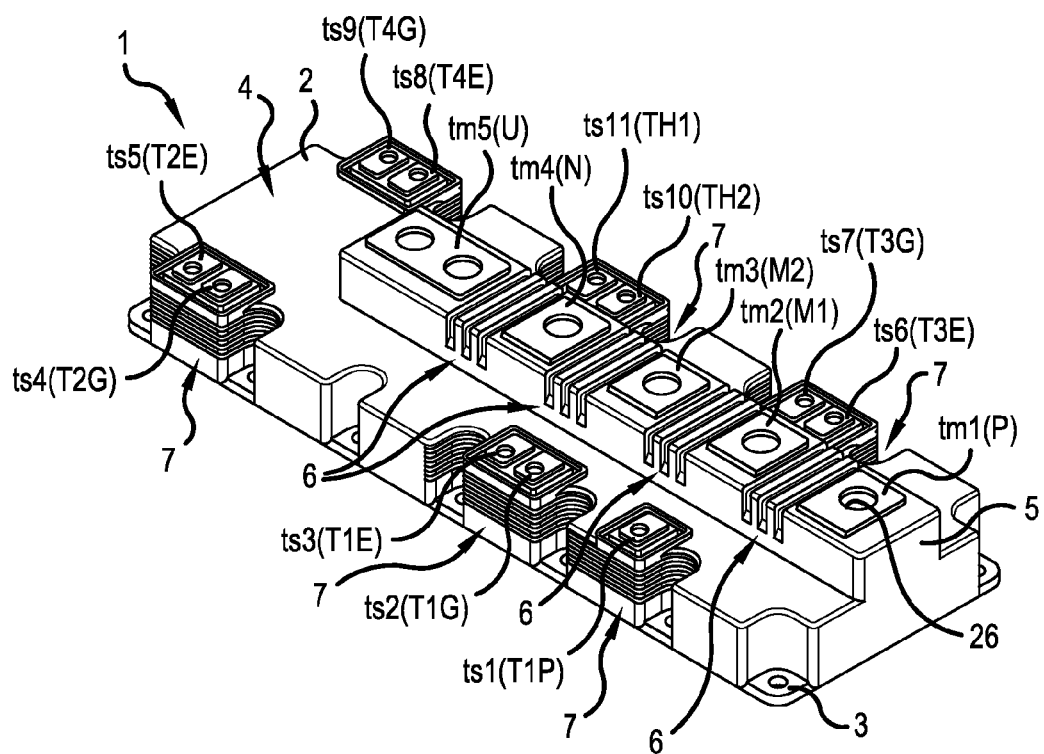
FIG. 1 is a perspective view showing a semiconductor system according to a first embodiment of the invention.
Figure 2:
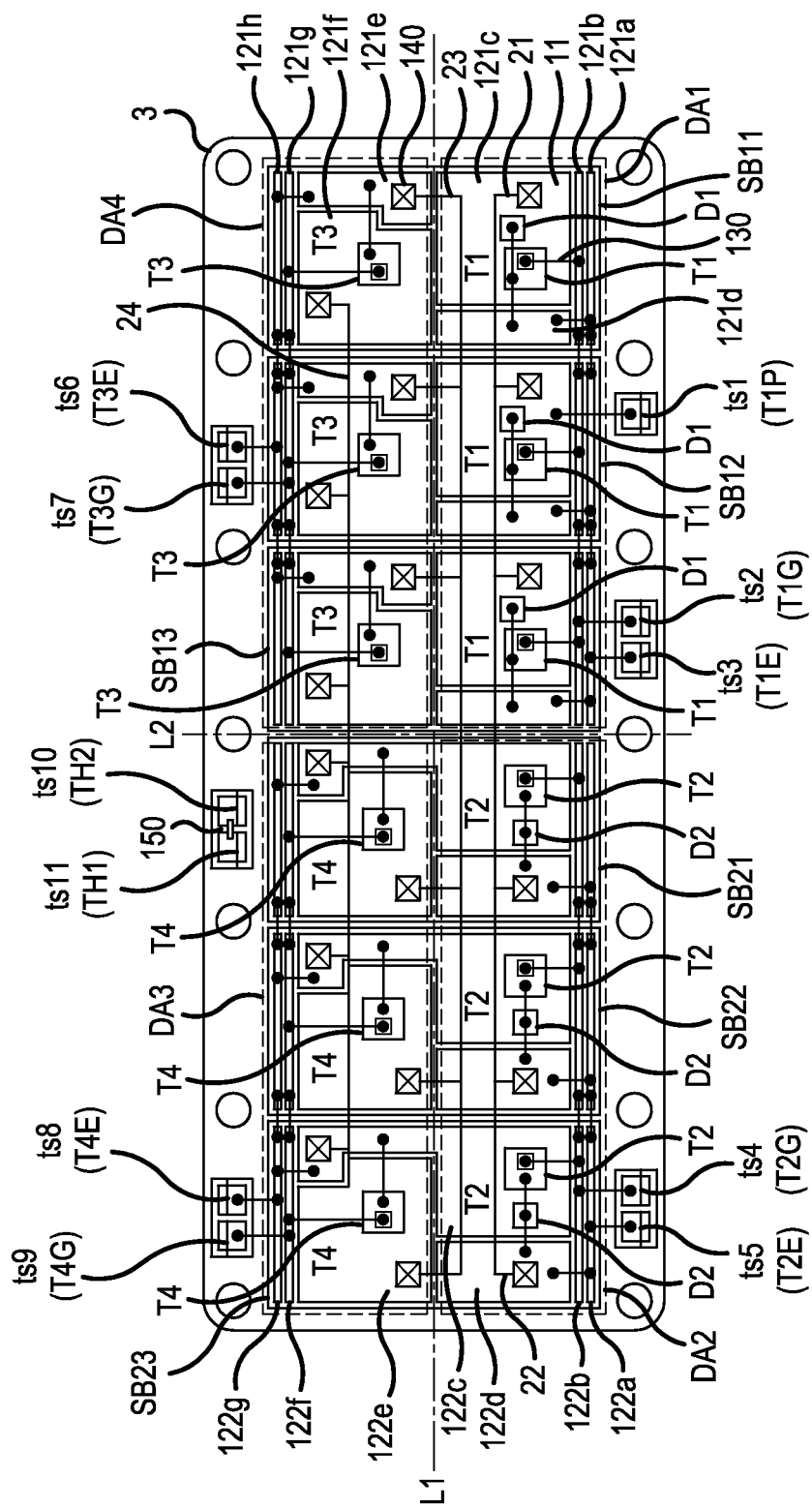
FIG. 2 is a plan view showing semiconductor devices mounted on insulating substrates joined onto the base plate of the semiconductor system shown in FIG. 1.
Figure 3:
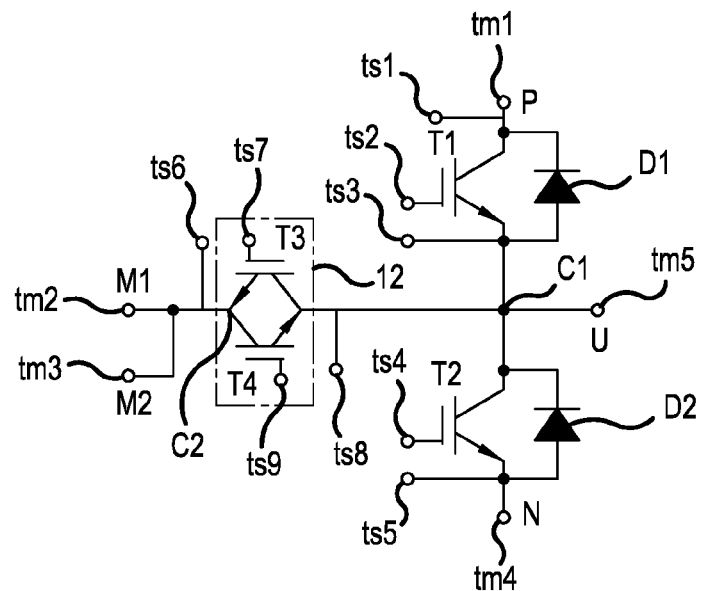
FIG. 3 is a circuit diagram showing an example of a three-level electric power inverter circuit.

FIG. 1 is a perspective view showing a semiconductor system according to a first embodiment of the invention. FIG. 2 is a plan view showing semiconductor devices mounted on insulating substrates joined onto the base plate of the semiconductor system shown in FIG. 1. The semiconductor system shown in FIG. 1 can be applied to a power conditioning subsystem (PCS). Moreover, FIG. 3 is a circuit diagram showing an example of a three-level electric power inverter circuit.

The semiconductor system 1, as is shown in FIG. 1, has a case 2 molded of insulating resin. The case 2 exposes holes provided in a base plate 3 for securing the base plate 3 by screws and, along with this, covers the other sections on the base plate 3. Moreover, the case 2 has a terminal arranging surface 4 formed on the upper surface side thereof. In the middle of the lateral direction on the terminal arranging surface 4, a linear projection 5 is provided which extends in the longitudinal direction of the terminal arranging surface 4. On the linear projection 5, from the right end side, a first external connection terminal tm1 (P) becoming a positive side terminal P of a DC power supply, a second external connection terminal tm2 (M1) and a third external connection terminal tm3 (M2) becoming intermediate terminals M1 and M2, respectively, a fourth external connection terminal tm4 (N) becoming an negative side terminal N of the DC power supply and a fifth external connection terminal tm5 (U) becoming an AC output terminal U are arranged in the order in series in a straight line.

On the front end side of the terminal arranging surface 4, there are arranged from the right side a first auxiliary terminal ts1 (T1P) outputting the collector voltage of an insulated gate bipolar transistor T1 that will be described later, a second auxiliary terminal ts2 (T1G) to be a gate terminal for supplying the gate voltage of the insulated gate bipolar transistor T1, a third auxiliary terminal ts3 (T1E) outputting the emitter voltage of the insulated gate bipolar transistor T1, a fourth auxiliary terminal ts4 (T2G) to be the gate terminal supplying the gate voltage of an insulated gate bipolar transistor T2 that will be described later and a fifth auxiliary terminal ts5 (T2E) outputting the emitter voltage of the insulated gate bipolar transistor T2.

On the rear end side of the terminal arranging surface 4, at the position to the right end thereof, there are arranged a sixth auxiliary terminal ts6 (T3E) from which the emitter voltage of an insulated gate bipolar transistor T3 that will be described later is outputted and a seventh auxiliary terminal ts7 (T3G) to be the gate terminal supplying the gate voltage of the insulated gate bipolar transistor T3 are provided side by side. Moreover, on the rear end side of the terminal arranging surface 4, at the position to the left end thereof, there are arranged an eighth auxiliary terminal ts8 (T4E) from which the emitter voltage of an insulated gate bipolar transistor T4 that will be described later is outputted and a ninth auxiliary terminal ts9 (T4G) to be the gate terminal supplying the gate voltage of the insulated gate bipolar transistor T4 are arranged side by side. Furthermore, on the rear end side of the terminal arranging surface 4, in the middle thereof, a tenth auxiliary terminal ts10 (TH2) and an eleventh auxiliary terminal ts11 (TH1) are arranged, which are connected to the thermistor 150 for being used for a thermistor 150 (FIG. 2) buried in the case 2 for detecting the inner temperature of the case 2.

In addition, the linear projection 5 has a plurality of lateral slits 6 formed in each of the section between the first external connection terminal tm1 and the second external connection terminal tm2, the section between the second external connection terminal tm2 and the third external connection terminal tm3, the section between the third external connection terminal tm3 and the fourth external connection terminal tm4 and the section between the fourth external connection terminal tm4 and the fifth external connection terminal tm5. The slits 6 are provided for extending the creepage distance in each of the foregoing sections so as to ensure the insulation therein. The case 2 also has a plurality of slits 7 formed similarly to the slits 6 in each of the sections below the first auxiliary terminal ts1 to the eleventh auxiliary terminal ts11. The slits 7 are provided for extending the creepage distance in the section between each of the auxiliary terminals ts1 to ts11 and the base plate 3 (at the ground potential) so as to ensure the insulation in the foregoing section. Here, the number of the slits 6 and the number of the slits 7 can be determined according to the desired dielectric breakdown voltage.

As is shown in FIG. 2, on the base plate 3, insulating substrates 11 are arranged each of which has conductor patterns formed on both of the surfaces of a ceramics (alumina, for example) substrate having good heat conductivity. In the example shown in FIG. 2, six insulating substrates 11 are arranged on the base plate 3. On every two of the six insulating substrates 11, four insulated gate bipolar transistors T1 to T4 are surface mounted to form a circuit for one phase shown in FIG. 3 of those for three phases of the three-level electric power converter (inverter) circuit. Of the four insulated gate bipolar transistors T1 to T4, the transistors T1 and T3 are surface mounted on the same insulating substrate 11 and the transistors T2 and T4 are surface mounted on the other same insulating substrate 11. Of the insulated gate bipolar transistors T1 to T4, the transistors T3 and T4 are reverse blocking insulated gate bipolar transistors.

In the example shown in FIG. 2, three of the insulating substrates 11 (denoted as SB11 to SB13) on each of which the insulated gate bipolar transistors T1 and T3 are surface mounted and three of the insulating substrates 11 (denoted as SB21 to SB23) on each of which the insulated gate bipolar transistors T2 and T4 are surface mounted are used with the insulating substrates SB11 to SB13 being connected in parallel and the insulating substrates SB21 to SB23 being connected in parallel.

Here, by a longitudinal center line L1 and a lateral center line L2 shown in FIG. 2, the whole area inside the case 2 on the base plate 3 is divided into four regions which are established as regions DA1, DA2, DA3 and DA 4, respectively, as shown in FIG. 2.

In the example shown in FIG. 2, in the region DA1, the insulated gate bipolar transistors T1 as semiconductor devices that will be explained later and free wheeling diodes D1 each connected in inverse parallel to the transistor T1 are arranged. Namely, in the area in the region DA1 on each of the insulating substrates SB11 to SB13, the insulated gate bipolar transistor T1 and the free wheeling diode D1 connected in inverse parallel thereto are mounted. Further, the insulated gate bipolar transistors T1 and the free wheeling diodes D1 are arranged in a straight line in the longitudinal direction of the base plate 3.

In the region DA2, the insulated gate bipolar transistors T2 as semiconductor devices that will be explained later and free wheeling diodes D2 each connected in inverse parallel to the transistor T2 are arranged. Namely, in the area in the region DA2 on each of the insulating substrates SB21 to SB23, the insulated gate bipolar transistor T2 and the free wheeling diode D2 connected in inverse parallel thereto are mounted. Further, the insulated gate bipolar transistors T2 and the free wheeling diodes D2 are arranged in a straight line in the longitudinal direction of the base plate 3.

In the region DA3, the reverse blocking insulated gate bipolar transistors T3 each being as a semiconductor device to be a bidirectional switching device that will be explained later are arranged. Namely, in an area in the region DA3 on each of the insulating substrates SB21 to SB23, the reverse blocking insulated gate bipolar transistor T3 is mounted. Further, the reverse blocking insulated gate bipolar transistors T3 are arranged in a straight line in the longitudinal direction of the base plate 3.

In the region DA4, the reverse blocking insulated gate bipolar transistors T4 each being as a semiconductor device to be a bidirectional switching device that will be explained later are arranged. Namely, in an area in the region DA4 on each of the insulating substrates SB11 to SB13, the reverse blocking insulated gate bipolar transistor T4 is mounted. Further, the reverse blocking insulated gate bipolar transistors T4 are arranged in a straight line in the longitudinal direction of the base plate 3.

Here, the circuit configuration of the three-level electric power converter (inverter) circuit contained in the semiconductor system 1, the circuit configuration for the U phase, for example, includes as is shown in FIG. 3, the insulated gate bipolar transistor T1, the insulated gate bipolar transistor T2 and a bidirectional switching device 12 connected to the connection point C1 of the emitter of the insulated gate bipolar transistor T1 and the collector of the insulated gate bipolar transistor T2.

The bidirectional switching device 12 is formed of the reverse blocking insulated gate bipolar transistor T3 with the collector thereof connected to the connection point C1 and the reverse blocking insulated gate bipolar transistor T4 connected in inverse parallel to the reverse blocking insulated gate bipolar transistor T3.

At one end of each of the insulating substrates SB11 to SB13, a conducting pattern 121a and a conducting pattern 121b are arranged. The conducting pattern 121a is electrically connected to the third auxiliary terminal ts3 (T1E) outputting the emitter voltage of the insulated gate bipolar transistor T1. The conducting pattern 121b is electrically connected to the second auxiliary terminal ts2 (T1G) to be the gate terminal supplying the gate voltage of the insulated gate bipolar transistor T1.

At the other end of each of the insulating substrates SB11 to SB13, a conducting pattern 121h and a conducting pattern 121g are arranged. The conducting pattern 121h is electrically connected to the sixth auxiliary terminal ts6 (T3E) outputting the emitter voltage of the insulated gate bipolar transistor T3. The conducting pattern 121g is electrically connected to the seventh auxiliary terminal ts7 (T3G) to be the gate terminal supplying the gate voltage of the insulated gate bipolar transistor T3.

Each of the insulating substrates SB11 to SB13 has a conducting pattern 121c and a conducting pattern 121d both being arranged in the region DA1 where the insulated gate bipolar transistor T1 is surface mounted. The conducting pattern 121c connects the collector of the insulated gate bipolar transistor T1 and the cathode of the free wheeling diode D1 by solder including tin or electrically conductive paste including conductive materials such as silver and tin. The conducting pattern 121d is electrically connected to the emitter of the insulated gate bipolar transistor T1.

Each of the insulating substrates SB11 to SB13 has a conducting pattern 121f and a conducting pattern 121e both being arranged in the region DA4 where the insulated gate bipolar transistor T3 is surface mounted. The conducting pattern 121f is connected to the collector of the insulated gate bipolar transistor T3 by solder including tin or electrically conductive paste including conductive materials such as silver and tin. The conducting pattern 121e is electrically connected to the emitter of the insulated gate bipolar transistor T3.

The conducting patterns 121a, 121b, 121g and 121h on the insulating substrate SB12 are connected to the conducting patterns 121a, 121b, 121g and 121h on the adjacent insulating substrate SB11 on the right and to the conducting patterns 121a, 121b, 121g and 121h on the adjacent insulating substrate SB13 on the left, respectively, by wires 130 drawn by somewhat thinner solid lines in FIG. 2.

The third auxiliary terminal ts3 (T1E) and the conducting pattern 121a on the insulating substrate SB13 are connected by the wire 130. Depending on the position of the third auxiliary terminal ts3 (T1E), the third auxiliary terminal ts3 (T1E) can be connected to the conducting pattern 121a on the insulating substrate SB11 or the insulating substrate SB12 by the wire 130.

The second auxiliary terminal ts2 (T1G) and the conducting pattern 121b on the insulating substrate SB13 are connected by the wire 130. Depending on the position of the second auxiliary terminal ts2 (T1G), the second auxiliary terminal ts2 (T1G) can be connected to the conducting pattern 121b on the insulating substrate SB11 or the insulating substrate SB12 by the wire 130.

The first auxiliary terminal ts1 (T1P) and the conducting pattern 121c on the insulating substrate SB12 are connected by the wire 130. Depending on the position of the first auxiliary terminal ts1 (T1P), the first auxiliary terminal ts1 (T1P) can be connected to the conducting pattern 121c on the insulating substrate SB11 or the insulating substrate SB13 by the wire 130.

The sixth auxiliary terminal ts6 (T3E) and the conducting pattern 121h on the insulating substrate SB12 are connected by the wire 130. Depending on the position of the sixth auxiliary terminal ts6 (T3E), the sixth auxiliary terminal ts6 (T3E) can be connected to the conducting pattern 121h on the insulating substrate SB11 or the insulating substrate SB13 by the wire 130.

The seventh auxiliary terminal ts7 (T3G) and the conducting pattern 121g on the insulating substrate SB12 are connected by the wire 130. Depending on the position of the seventh auxiliary terminal ts7 (T3G), the seventh auxiliary terminal ts7 (T3G) can be connected to the conducting pattern 121g on the insulating substrate SB11 or the insulating substrate SB13 by the wire 130.

The gate pad of the insulated gate bipolar transistor T1 and the conducting pattern 121b are connected by the wire 130. The emitter of the insulated gate bipolar transistor T1, the anode of the free wheeling diode D1 and the conducting pattern 121d are connected by the wire 130.

The gate pad of the reverse blocking insulated gate bipolar transistor T3 and the conducting pattern 121g are connected by the wire 130. The emitter of the reverse blocking insulated gate bipolar transistor T3 and the conducting pattern 121e are connected by the wire 130.

Moreover, the conducting pattern 121d and the conducting pattern 121a are also connected by the wire 130.

At one end of each of the insulating substrates SB21 to SB23, a conducting pattern 122a and a conducting pattern 122b are arranged. The conducting pattern 122a is electrically connected to the fifth auxiliary terminal ts5 (T2E) outputting the emitter voltage of the insulated gate bipolar transistor T2. The conducting pattern 122b is electrically connected to the fourth auxiliary terminal ts4 (T2G) to be the gate terminal supplying the gate voltage of the insulated gate bipolar transistor T2.

At the other end of each of the insulating substrates SB21 to SB23, a conducting pattern 122g and a conducting pattern 122f are arranged. The conducting pattern 122g is electrically connected to the eighth auxiliary terminal ts8 (T4E) outputting the emitter voltage of the insulated gate bipolar transistor T4. The conducting pattern 122f is electrically connected to the ninth auxiliary terminal ts9 (T4G) to be the gate terminal supplying the gate voltage of the insulated gate bipolar transistor T4.

Each of the insulating substrates SB21 to SB23 has a conducting pattern 122c and a conducting pattern 122d both being arranged in the region DA2 where the insulated gate bipolar transistor T2 is surface mounted. The conducting pattern 122c connects the collector of the insulated gate bipolar transistor T2 and the cathode of the free wheeling diode D2 by solder including tin or electrically conductive paste including conductive materials such as silver and tin. The conducting pattern 122d is electrically connected to the emitter of the insulated gate bipolar transistor T2.

Here, the conducting pattern 122c is arranged over the region DA2 and the region DA3 so that the collector of the insulated gate bipolar transistor T2 and the emitter of the reverse blocking insulated gate bipolar transistor T4 are electrically connected to each other.

Each of the insulating substrates SB21 to SB23 has a conducting pattern 122e and a part of the conducting pattern 122c both being arranged in the region DA3 where the reverse blocking insulated gate bipolar transistor T4 is surface mounted. The conducting pattern 122c is connected to the collector of the reverse blocking insulated gate bipolar transistor T4 by solder including tin or electrically conductive paste including conductive materials such as silver and tin. The part of the conducting pattern 122c is electrically connected to the emitter of the reverse blocking insulated gate bipolar transistor T4.

The conducting patterns 122a, 122b, 122g and 122f on the insulating substrate SB22 are connected to the conducting patterns 122a, 122b, 122g and 122f on the adjacent insulating substrate SB21 on the right and to the conducting patterns 122a, 122b, 122g and 122f on the adjacent insulating substrate SB23 on the left, respectively, by the wires 130.

The fourth auxiliary terminal ts4 (T2G) and the conducting pattern 122b on the insulating substrate SB23 are connected by the wire 130. Depending on the position of the fourth auxiliary terminal ts4 (T2G), the fourth auxiliary terminal ts4 (T2G) can be connected to the conducting pattern 122b on the insulating substrate SB21 or the insulating substrate SB22 by the wire 130.

The fifth auxiliary terminal ts5 (T2E) and the conducting pattern 122a on the insulating substrate SB23 are connected by the wire 130. Depending on the position of the fifth auxiliary terminal ts5 (T2E), the fifth auxiliary terminal ts5 (T2E) can be connected to the conducting pattern 122a on the insulating substrate SB21 or the insulating substrate SB22 by the wire 130.

The eighth auxiliary terminal ts8 (T4E) and the conducting pattern 122g on the insulating substrate SB23 are connected by the wire 130. Depending on the position of the eighth auxiliary terminal ts8 (T4E), the eighth auxiliary terminal ts8 (T4E) can be connected to the conducting pattern 122g on the insulating substrate SB21 or the insulating substrate SB22 by the wire 130.

The ninth auxiliary terminal ts9 (T4G) and the conducting pattern 122f on the insulating substrate SB23 are connected by the wire 130. Depending on the position of the ninth auxiliary terminal ts9 (T4G), the ninth auxiliary terminal ts9 (T4G) can be connected to the conducting pattern 122f on the insulating substrate SB21 or the insulating substrate SB22 by the wire 130.

The gate pad of the insulated gate bipolar transistor T2 and the conducting pattern 122b are connected by the wire 130. The emitter of the insulated gate bipolar transistor T2, the anode of the free wheeling diode D2 and the conducting pattern 122d are connected by the wire 130.

The gate pad of the reverse blocking insulated gate bipolar transistor T4 and the conducting pattern 122f are connected by the wire 130. The emitter of the reverse blocking insulated gate bipolar transistor T4 and the conducting pattern 121g are connected by the wire 130.

Moreover, the conducting pattern 122d and the conducting pattern 122a are also connected by the wire 130.

In addition, the connection point C2 of the emitter of the reverse blocking insulated gate bipolar transistor T3 and the collector of the reverse blocking insulated gate bipolar transistor T4 in the bidirectional switching device 12 is connected to the second external connection terminal tm2 (M1) to be an intermediate terminal M1 forming a main circuit terminal.

Further, the collector of the insulated gate bipolar transistor T1 is connected to the first external connection terminal tm1 (P) as a positive side terminal to be connected to the positive electrode side of the DC power supply.

Furthermore, the emitter of the insulated gate bipolar transistor T2 is connected to the fourth external connection terminal tm4 (N) as a negative side terminal to be connected to the negative electrode side of the DC power supply.

Still further, the connection point C2 of the emitter of the reverse blocking insulated gate bipolar transistor T3 and the collector of the reverse blocking insulated gate bipolar transistor T4 in the bidirectional switching device 12 is connected to the second external connection terminal tm2 (M1) and the third external connection terminal tm3 (M2) connected to the second external connection terminal tm2 (M1) to be at the same potential as the potential thereof.

In addition, the connection point C1 of the emitter of the insulated gate bipolar transistor T1 and the collector of the insulated gate bipolar transistor T2 is connected to the fifth external connection terminal tm5 (U) as an AC output terminal.

In the embodiment, the circuit for one phase (U phase, for example) of the three-level electric power inverter circuit is formed with four insulated gate bipolar transistors T1 to T4. Of the insulated gate bipolar transistors T1 to T4, the insulated gate bipolar transistor T1 and the reverse blocking insulated gate bipolar transistor T3 are mounted on each of the insulating substrates SB11 to SB 13, in which the transistors T1 are connected in parallel to one another and the transistors T3 are connected also in parallel to one another. Moreover, the insulated gate bipolar transistor T2 and the reverse blocking insulated gate bipolar transistor T4 are mounted on each of the insulating substrates SB21 to SB 23, in which the transistors T2 are connected in parallel to one another and the transistors T4 are connected also in parallel to one another. In this way, the semiconductor system shown in FIG. 2 is formed.

Therefore, letting the current capacity of the insulated gate bipolar transistors T1 and T3 mounted on an insulating substrate SB11 and the insulated gate bipolar transistors T2 and T4 mounted on an insulating substrate SB21 be 300 A in total, by providing three combinations of the insulating substrates SB11 and SB 21, SB12 and SB 22 and SB13 and SB 23, the current capacities of all of the insulated gate bipolar transistors T1 to T4 become 900 A in a sum total.

To each of the insulating substrates SB11 to SB13, a positive side conductor plate 21 is connected and, to each of the insulating substrates SB21 to SB 23, a negative side conductor plate 22 is connected as is shown by somewhat thick solid lines in FIG. 2. Moreover, to each of the insulating substrates SB11 to SB13 and the insulating substrates SB21 to SB 23, a common intermediate potential conductor plate 23 is connected as is shown by a somewhat thick solid line in FIG. 2. Further, to each of the insulating substrates SB11 to SB13 and the insulating substrates SB21 to SB 23, a common AC output conductor plate 24 is connected as is shown by a somewhat thick solid line in FIG. 2.

Figure 4:
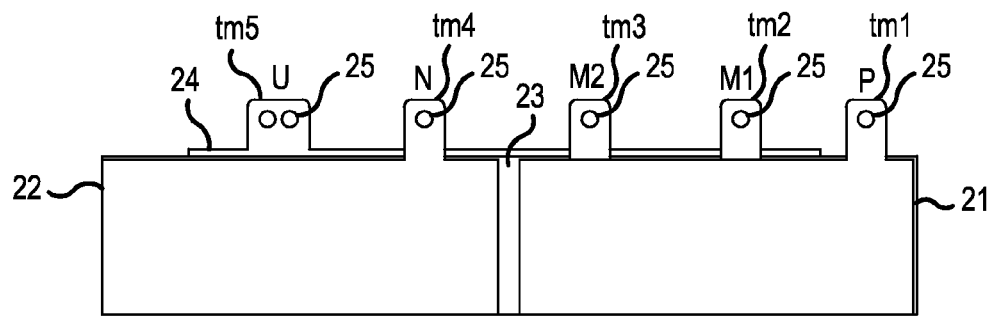
FIG. 4 is an elevational view showing arrangements of the positive side conductor plate, negative side conductor plate, intermediate potential conductor plate and AC output conductor plate.

FIG. 4 is an elevational view showing arrangements of the positive side conductor plate 21, negative side conductor plate 22, intermediate potential conductor plate 23 and AC output conductor plate 24.

The positive side conductor plate 21, negative side conductor plate 22, intermediate potential conductor plate 23 and AC output conductor plate 24 stand up in the vertical direction to the insulating substrates SB11 to SB13 and the insulating substrates SB21 to SB 23 and are extended rightward and leftward. The positive side conductor plate 21 and the negative side conductor plate 22 are, as they are shown in FIG. 2, arranged to face the one side, i.e. the front side of the intermediate potential conductor plate 23 in proximity thereto. The AC output conductor plate 24 is arranged to face the rear side of the intermediate potential conductor plate 23 in proximity thereto.

The intermediate potential conductor plate 23 has the second external connection terminal tm2 (M1) formed on the right side thereof to extend upward and has the third external connection terminal tm3 (M2) formed in the middle thereof to extend upward. Moreover, the positive side conductor plate 21 has the first external connection terminal tm1 (P) at a position formed on the right side of the second external connection terminal tm2 (M1) to extend upward. Further, the negative side conductor plate 22 has the fourth external connection terminal tm4 (N) formed at a position on the left side of the third external connection terminal tm3 (M2) to extend upward. Still further, the AC output conductor plate 24 has the fifth external connection terminal tm5 (U) formed on the left side of the fourth external connection terminal tm4 (N) to extend upward.

Each of the first external connection terminal tm1(P) to the fifth external connection terminal tm5(U) has a through hole 25 formed at the top thereof.

The case 2 has recesses (not shown), each being formed for inserting a nut, at the positions where the first external connection terminal tm1(P) to the fifth external connection terminal tm5(U) are to be arranged, respectively, on the top surface of the linear projection 5 of the case 2 and a nut (not shown) is inserted in each of the recesses. The first external connection terminal tm1(P) to the fifth external connection terminal tm5(U) have their respective top ends projected upward from the top surface of the linear projection 5 of the case 2 and then folded at the position at the top surface of the linear projection 5 to make their respective through holes 25 face the internal threads 26 of the nuts inserted in the recesses in the linear projection 5.

In the next, the operation of the foregoing first embodiment will be explained.

FIGS. 5 to 8 are schematic views illustrating states of heat generation in the semiconductor devices for each operation mode of the semiconductor system according to the first embodiment of the invention.

In FIGS. 5 to 8, as an example of the first embodiment, an example of a modification is shown in which each of the insulating substrates SB11 to SB13 and SB21 to SB23 is divided into two on each of which one insulated gate bipolar transistor is mounted. In the example, three of such insulating substrates are arranged in each of the regions DA 1 to DA4.

Figure 5:
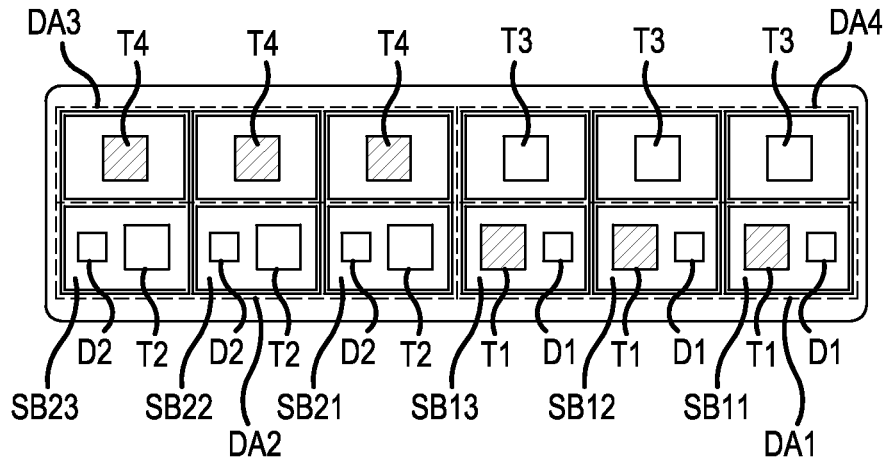
FIG. 5 is a schematic view illustrating states of heat generation of the semiconductor devices in an operation mode of the semiconductor system according to the first embodiment of the invention.

When an operation is in a mode in which a gate pulse is inputted to each of the gates of the insulated gate bipolar transistors T1 to switch the transistors T1 with the reverse blocking insulated gate bipolar transistors T4 being brought into recovery, the insulated gate bipolar transistors T1 arranged in the insulating substrates SB11 to SB13 in the region DA1 and the reverse blocking insulated gate bipolar transistors T4 mounted on the insulating substrates SB21 to SB23 in the region DA3 positioned diagonally from the region DA1 are to generate heat as is shown by hatch patterns in FIG. 5. While, in the regions DA2 and DA4, no heat is generated.

Figure 6:
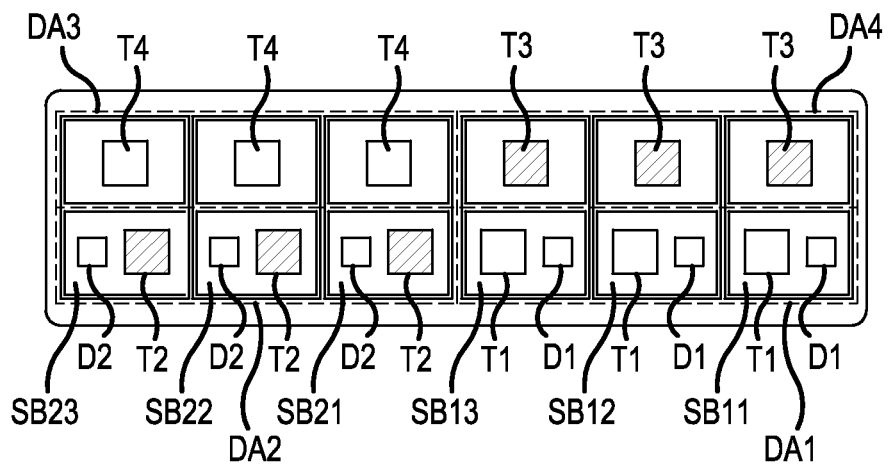
FIG. 6 is a schematic view illustrating states of heat generation of the semiconductor devices in another operation mode of the semiconductor system according to the first embodiment of the invention.

When an operation is brought into a mode in which a gate pulse is supplied to each of the gates of the insulated gate bipolar transistors T2 to switch the transistors T2 with the reverse blocking insulated gate bipolar transistors T3 being brought into recovery, the insulated gate bipolar transistors T2 mounted on the insulating substrates SB21 to SB23 in the region DA2 and the reverse blocking insulated gate bipolar transistors T3 mounted on the insulating substrates SB11 to SB13 in the region DA4 positioned diagonally from the region DA2 are to generate heat as is shown by hatch patterns in FIG. 6. While, in the regions DA1 and region DA3, no heat is generated.

Figure 7:
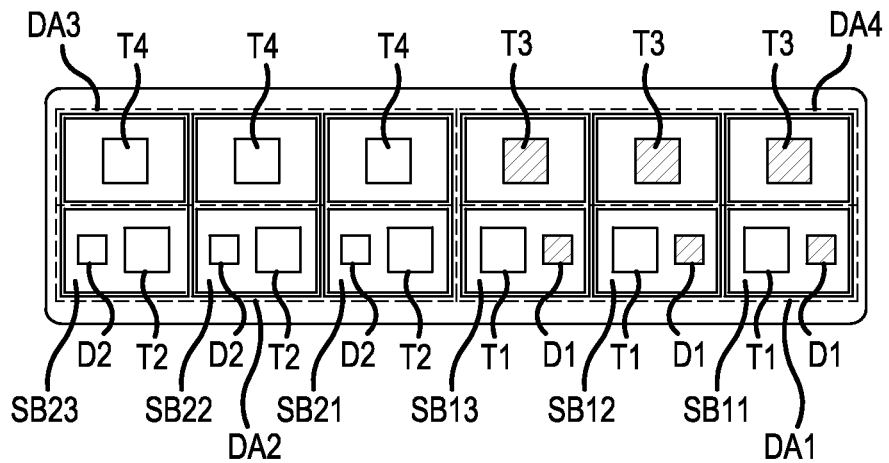
FIG. 7 is a schematic view illustrating states of heat generation of the semiconductor devices in further another operation mode of the semiconductor system according to the first embodiment of the invention.

Moreover, when an operation is in a mode in which a gate pulse is supplied to each of the gates of the reverse blocking insulated gate bipolar transistors T3 to switch the transistors T3 with the insulated gate bipolar transistors T1 being brought into recovery, the free wheeling diodes D1 mounted on the insulating substrates SB11 to SB13 in the region DA1 generate heat and, along with this, the reverse blocking insulated gate bipolar transistors T3 mounted on the insulating substrates SB11 to SB13 in the region DA4 positioned so as to be adjacent to the region DA1 in the lateral direction are to generate heat as is shown by hatch patterns in FIG. 7. While, in the regions DA2 and DA4, no heat is generated.

Figure 8:
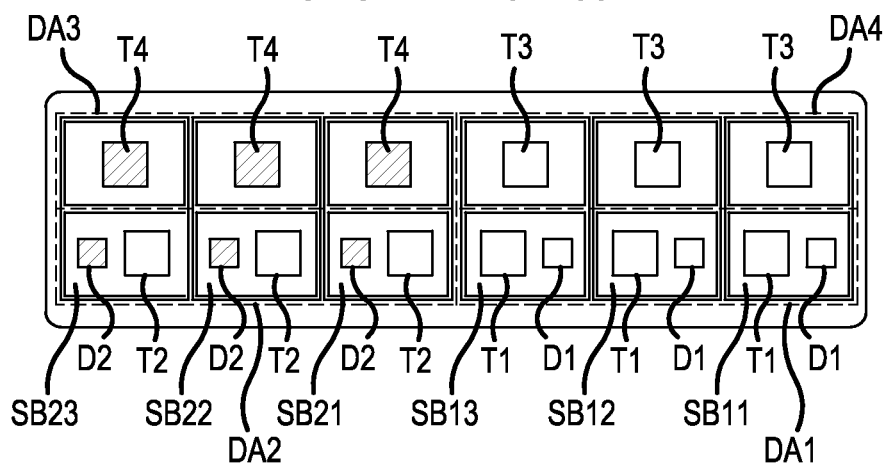
FIG. 8 is a schematic view illustrating states of heat generation of the semiconductor devices in still further another operation mode of the semiconductor system according to the first embodiment of the invention.

Furthermore, when an operation is in a mode in which a gate pulse is supplied to each of the gates of the reverse blocking insulated gate bipolar transistors T4 to switch the transistors T4 with the insulated gate bipolar transistors T2 being brought into recovery, the free wheeling diodes D2 mounted on the insulating substrates SB21 to SB23 in the region DA2 generate heat and, along with this, the reverse blocking insulated gate bipolar transistors T4 mounted on the insulating substrates SB21 to SB23 in the region DA3 positioned so as to be adjacent to the region DA2 in the lateral direction are to generate heat as is shown by hatch patterns in FIG. 8. While, in the regions DA1 and DA4, no heat is generated.

In this way, according to the first embodiment, when the semiconductor system 1 is brought into an operating state, heat is not generated in all of the regions DA1 to DA4 but is generated only in two regions positioned diagonally from each other or in two regions positioned so as to be adjacent to each other in the lateral direction. That is, heat is generated only in partial two regions according to an operation mode.

Therefore, compared with the case in which heat is generated in the whole insulating substrate like in the foregoing examples of the related modules, generated heat can be dispersed to enable the semiconductor system 1 to be reliably prevented from being brought into an overheated state.

In addition, when using the semiconductor system 1 of the embodiment as a power conditioning subsystem (PCS) in a mega solar system, the semiconductor system 1 is only operated as an inverter, which makes the free wheeling diodes D1 and D2 generate a little amount of heat. Therefore, in the modes shown in foregoing FIG. 7 and FIG. 8, the free wheeling diode D1 and D2 generate a little heat. This can prevent the region DA3 in the insulating substrates SB21 to SB23 each mounting the reverse blocking insulated gate bipolar transistor T3 generating a large amount of heat and the region DA4 in the insulating substrates SB11 to SB 13 each mounting the reverse blocking insulated gate bipolar transistor T4 generating a large amount of heat from simultaneously generating heat and causing thermal interference.

Therefore, according to the first embodiment, heat generating regions are changed for each operation mode and, along with this, the heat generating regions are partially presented to enable efficient heat dispersion.

In the first embodiment, the positive side conductor plate 21 and the negative side conductor plate 22 are arranged to face the one side, i.e. the front side of the intermediate potential conductor plate 23 in close proximity thereto. Thus, a current flows from the first external connection terminal tm1 (P) to the second external connection terminal tm2 (M1) or the third external connection terminal tm3 (M2) through each of the insulated gate bipolar transistors T1 and further through each of the reverse blocking insulated gate bipolar transistors T3. This brings a state in which the direction of a current flowing in the intermediate potential conductor plate 23 and the direction of a current flowing in the positive side conductor plate 21 are opposite to each other. In the state, since the intermediate potential conductor plate 23 and the positive side conductor plate 21 are arranged in close proximity to each other, the magnetic field generated by a current flowing in the intermediate potential conductor plate 23 and the magnetic field generated by a current flowing in the positive side conductor plate 21 are cancelled with each other. Hence, the influence of the resulting magnetic field on the current flowing in the intermediate potential conductor plate 23 and the current flowing in the positive side conductor plate 21 becomes small, which can reduce the resultant inductance between the intermediate potential conductor plate 23 and the positive side conductor plate 21.

In the same way, when a current flows from the second external connection terminal tm2 (M1) or the third external connection terminal tm3 (M2) to the fourth external connection terminal tm4 (N) through each of the reverse blocking insulated gate bipolar transistors T4 and further through each of the insulated gate bipolar transistors T2, the direction of a current flowing in the intermediate potential conductor plate 23 and the direction of a current flowing in the negative side conductor plate 22 become also opposite to each other, by which an inductance between the intermediate potential conductor plate 23 and the negative side conductor plate 22 in proximity to each other can be reduced.

In addition, each of the positive side conductor plate 21 and the negative side conductor plate 22 facing the intermediate potential conductor plate 23 can provide a wide facing area to the intermediate potential conductor plate 23, by which the effect of inductance reduction can be better exhibited.

Furthermore, the positive side conductor plate 21 and the negative side conductor plate 22 arranged in a straight line enable the positive side conductor plate 21 and the negative side conductor plate 22 to be electrically connected to the conducting pattern 121c on each of the insulating substrates SB11 to SB13 and to the conducting pattern 122d on each of the insulating substrates SB21 to SB 23, respectively, by, for example, ultrasonic bonding at junctions 140 shown in FIG. 2.

In the next, a second embodiment of the invention will be explained with reference to FIG. 9 and FIG. 10.

Figure 9:
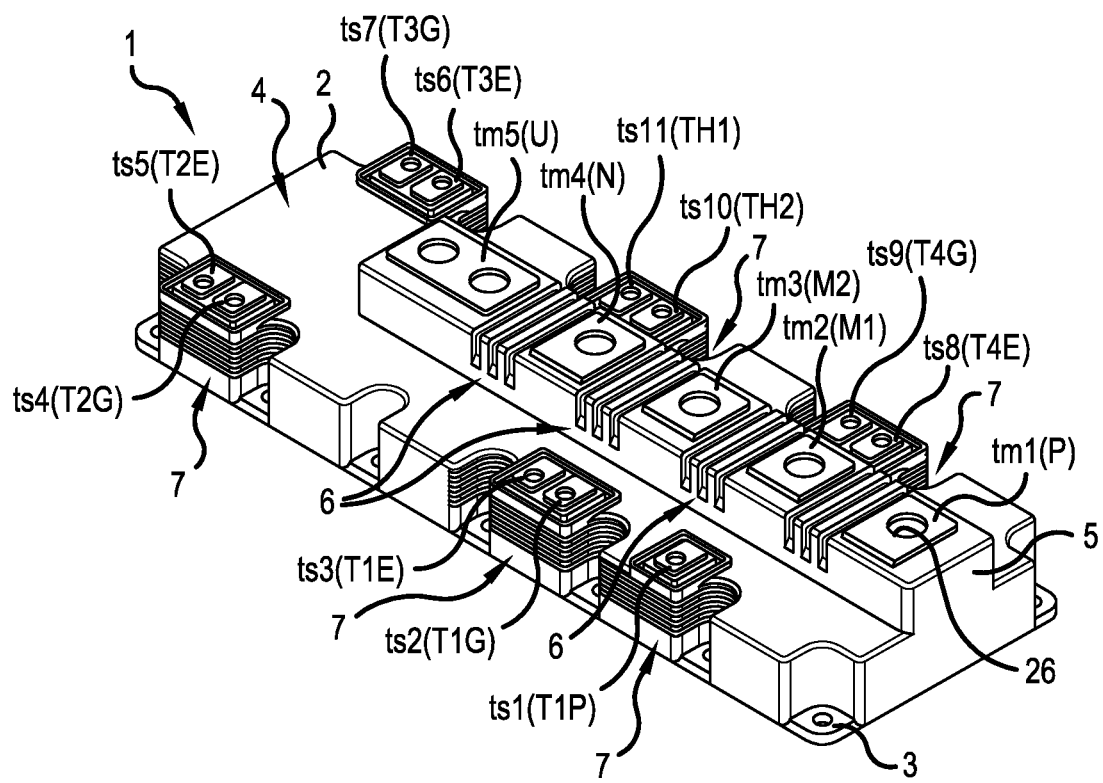
FIG. 9 is a perspective view showing a semiconductor system according to a second embodiment of the invention.

FIG. 9 is a perspective view showing a semiconductor system according to a second embodiment of the invention. FIG. 10 is a plan view showing semiconductor devices mounted on insulating substrates joined onto the base plate of the semiconductor system shown in FIG. 9.

The second embodiment is a semiconductor system in which the arranged position of each of the reverse blocking insulated gate bipolar transistors T3 and the arranged position of each of the reverse blocking insulated gate bipolar transistors T4 in the first embodiment are changed with each other.

Figure 10:
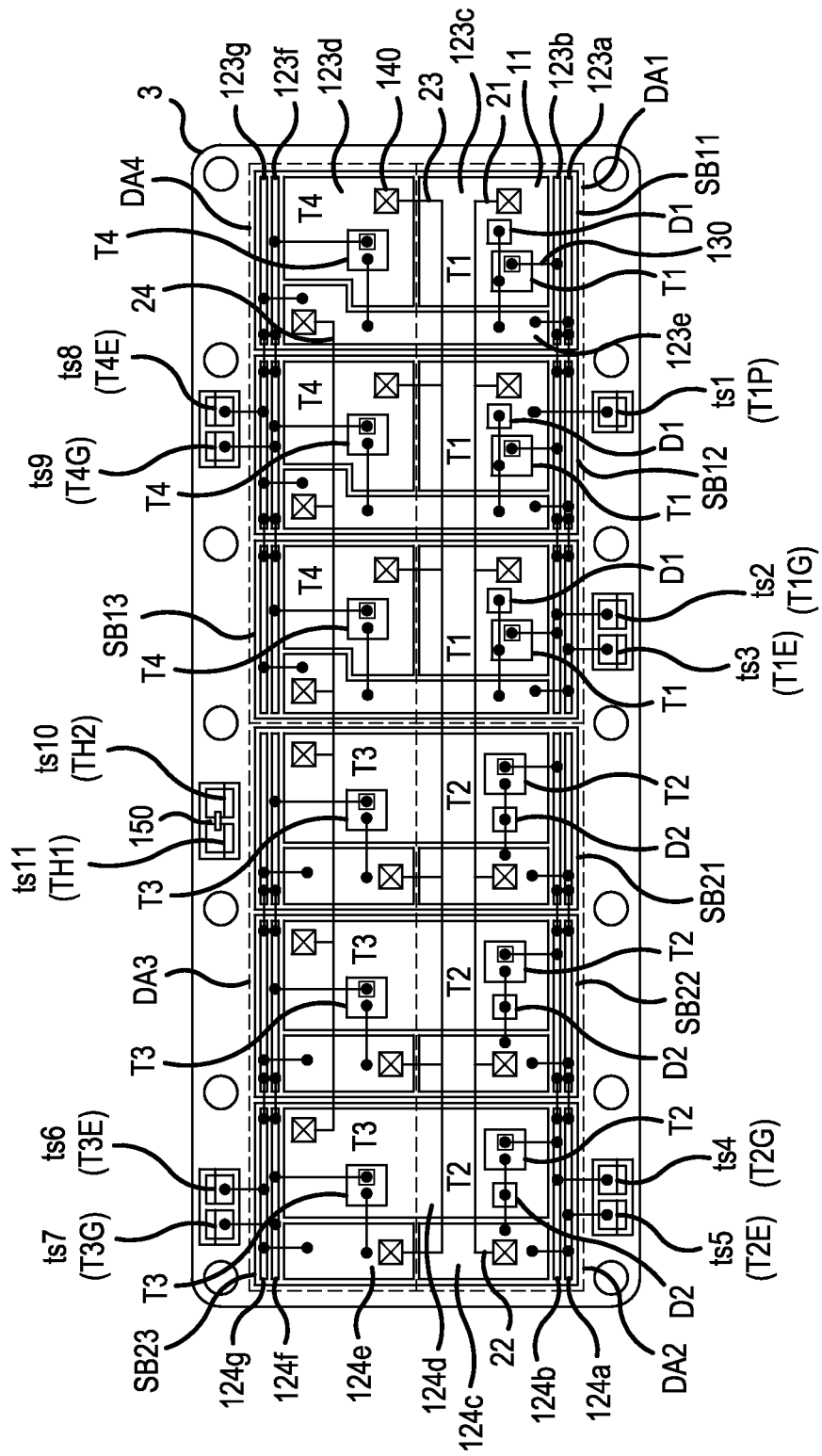
FIG. 10 is a plan view showing a semiconductor devices mounted on insulating substrates joined onto the base plate of the semiconductor system shown in FIG. 9.

Namely, in the second embodiment, as is shown in FIG. 10, the reverse blocking insulated gate bipolar transistors T4, which were arranged in the region DA3 on the base plate 3 in the foregoing first embodiment, are mounted on the insulating substrates SB11 to SB13 to be arranged in the region DA4. Accompanied with this, the reverse blocking insulated gate bipolar transistors T3, which were arranged in the region DA4 on the base plate 3 in the foregoing first embodiment, are mounted on the insulating substrates SB21 to SB23 to be arranged in the region DA3. Accompanied with this, the conducting patterns on the insulating substrate 11 are changed from those in the first embodiment.

At one end of each of the insulating substrates SB11 to SB13, a conducting pattern 123a and a conducting pattern 123b are arranged. The conducting pattern 123a is electrically connected to the third auxiliary terminal ts3 (T1E) outputting the emitter voltage of the insulated gate bipolar transistor T1. The conducting pattern 123b is electrically connected to the second auxiliary terminal ts2 (T1G) to be the gate terminal supplying the gate voltage of the insulated gate bipolar transistor T1.

At the other end of each of the insulating substrates SB11 to SB13, a conducting pattern 123g and a conducting pattern 123f are arranged. The conducting pattern 123g is electrically connected to the eighth auxiliary terminal ts8 (T4E) outputting the emitter voltage of the reverse blocking insulated gate bipolar transistor T4. The conducting pattern 123f is electrically connected to the ninth auxiliary terminal ts9 (T4G) to be the gate terminal supplying the gate voltage of the reverse blocking insulated gate bipolar transistor T4.

Each of the insulating substrates SB11 to SB13 has a conducting pattern 123c and a conducting pattern 123e both being arranged in the region DA1 where the insulated gate bipolar transistor T1 is surface mounted. The conducting pattern 123c connects the collector of the insulated gate bipolar transistor T1 and the cathode of the free wheeling diode D1 by solder including tin or electrically conductive paste including conductive materials such as silver and tin. The conducting pattern 123e is electrically connected to the emitter of the insulated gate bipolar transistor T1.

Here, the conducting pattern 123e is arranged over the region DA1 and the region DA4 so that the emitter of the insulated gate bipolar transistor T1 and the emitter of the reverse blocking insulated gate bipolar transistor T4 are electrically connected to each other.

Each of the insulating substrates SB11 to SB13 has a conducting pattern 123d and the conducting pattern 123e both being arranged in the region DA4 where the reverse blocking insulated gate bipolar transistor T4 is surface mounted. The conducting pattern 123d is connected to the collector of the reverse blocking insulated gate bipolar transistor T4 by solder including tin or electrically conductive paste including conductive materials such as silver and tin. The conducting pattern 123e is electrically connected to the emitter of the reverse blocking insulated gate bipolar transistor T4.

The conducting patterns 123a, 123b, 123f and 123g on the insulating substrate SB12 are connected to the conducting patterns 123a, 123b, 123f and 123g on the adjacent insulating substrate SB11 on the right and to the conducting patterns 123a, 123b, 123f and 123g on the adjacent insulating substrate SB13 on the left, respectively, by wires 130 drawn by relatively thinner solid lines in FIG. 10.

The third auxiliary terminal ts3 (T1E) and the conducting pattern 123a on the insulating substrate SB13 are connected by the wire 130. Depending on the position of the third auxiliary terminal ts3 (T1E), the third auxiliary terminal ts3 (T1E) can be connected to the conducting pattern 123a on the insulating substrate SB11 or the insulating substrate SB12 by the wire 130.

The second auxiliary terminal ts2 (T1G) and the conducting pattern 123b on the insulating substrate SB13 are connected by the wire 130. Depending on the position of the second auxiliary terminal ts2 (T1G), the second auxiliary terminal ts2 (T1G) can be connected to the conducting pattern 123b on the insulating substrate SB11 or the insulating substrate SB12 by the wire 130.

The first auxiliary terminal ts1 (T1P) and the conducting pattern 123c on the insulating substrate SB12 are connected by the wire 130. Depending on the position of the first auxiliary terminal ts1 (T1P), the first auxiliary terminal ts1 (T1P) can be connected to the conducting pattern 123c on the insulating substrate SB11 or the insulating substrate SB13 by the wire 130.

The eighth auxiliary terminal ts8 (T4E) and the conducting pattern 123g on the insulating substrate SB12 are connected by the wire 130. Depending on the position of the eighth auxiliary terminal ts8 (T4E), the eighth auxiliary terminal ts8 (T4E) can be connected to the conducting pattern 123g on the insulating substrate SB11 or the insulating substrate SB13 by the wire 130.

The ninth auxiliary terminal ts9 (T4G) and the conducting pattern 123f on the insulating substrate SB12 are connected by the wire 130. Depending on the position of the seventh auxiliary terminal ts9 (T4G), the seventh auxiliary terminal ts9 (T4G) can be connected to the conducting pattern 123f on the insulating substrate SB11 or the insulating substrate SB13 by the wire 130.

The gate pad of the insulated gate bipolar transistor T1 and the conducting pattern 123b are connected by the wire 130. The emitter of the insulated gate bipolar transistor T1, the anode of the free wheeling diode D1 and the conducting pattern 123e are connected by the wire 130.

The gate pad of the reverse blocking insulated gate bipolar transistor T4 and the conducting pattern 123f are connected by the wire 130. The emitter of the reverse blocking insulated gate bipolar transistor T4 and the conducting pattern 123e are connected by the wire 130.

Moreover, the conducting pattern 123e is also connected to the conducting pattern 123a and the conducting pattern 123g by the wires 130.

At one end of each of the insulating substrates SB21 to SB23, a conducting pattern 124a and a conducting pattern 124b are arranged. The conducting pattern 124a is electrically connected to the fifth auxiliary terminal ts5 (T2E) outputting the emitter voltage of the insulated gate bipolar transistor T2. The conducting pattern 124b is electrically connected to the fourth auxiliary terminal ts4 (T2G) to be the gate terminal supplying the gate voltage of the insulated gate bipolar transistor T2.

At the other end of each of the insulating substrates SB21 to SB23, a conducting pattern 124g and a conducting pattern 124f are arranged. The conducting pattern 124g is electrically connected to the sixth auxiliary terminal ts6 (T3E) outputting the emitter voltage of the reverse blocking insulated gate bipolar transistor T3. The conducting pattern 124f is electrically connected to the seventh auxiliary terminal ts7 (T3G) to be the gate terminal supplying the gate voltage of the reverse blocking insulated gate bipolar transistor T3.

Each of the insulating substrates SB21 to SB23 has a conducting pattern 124d and a conducting pattern 124c both being arranged in the region DA2 where the insulated gate bipolar transistor T2 is surface mounted. The conducting pattern 124d connects the collector of the insulated gate bipolar transistor T2 and the cathode of the free wheeling diode D2 by solder including tin or electrically conductive paste including conductive materials such as silver and tin. The conducting pattern 124c is electrically connected to the emitter of the insulated gate bipolar transistor T2.

Here, the conducting pattern 124d is arranged over the region DA2 and the region DA3 so that the collector of the insulated gate bipolar transistor T2, the cathode of the free wheeling diode D2 and the collector of the reverse blocking insulated gate bipolar transistor T3 are electrically connected to one another.

Each of the insulating substrates SB21 to SB23 has the conducting pattern 124d and a conducting pattern 124e both being arranged in the region DA3 where the reverse blocking insulated gate bipolar transistor T3 is surface mounted. The conducting pattern 124d connects the collector of the reverse blocking insulated gate bipolar transistor T3 by solder including tin or electrically conductive paste including conductive materials such as silver and tin. The conducting pattern 124e is electrically connected to the emitter of the reverse blocking insulated gate bipolar transistor T3.

The conducting patterns 124a, 124b, 124f and 124g on the insulating substrate SB22 are connected to the conducting patterns 124a, 124b, 124f and 124g on the adjacent insulating substrate SB21 on the right and to the conducting patterns 124a, 124b, 124f and 124g on the adjacent insulating substrate SB23 on the left, respectively, by the wires 130 drawn by relatively thinner solid lines in FIG. 10.

The fourth auxiliary terminal ts4 (T2G) and the conducting pattern 124b on the insulating substrate SB23 are connected by the wire 130. Depending on the position of the fourth auxiliary terminal ts4 (T2G), the fourth auxiliary terminal ts4 (T2G) can be connected to the conducting pattern 124b on the insulating substrate SB21 or the insulating substrate SB22 by the wire 130.

The fifth auxiliary terminal ts5 (T2E) and the conducting pattern 124a on the insulating substrate SB23 are connected by the wire 130. Depending on the position of the fifth auxiliary terminal ts5 (T2E), the fifth auxiliary terminal ts5 (T2E) can be connected to the conducting pattern 124a on the insulating substrate SB21 or the insulating substrate SB22 by the wire 130.

The sixth auxiliary terminal ts6 (T3E) and the conducting pattern 124g on the insulating substrate SB23 are connected by the wire 130. Depending on the position of the sixth auxiliary terminal ts6 (T3E), the sixth auxiliary terminal ts6

(T3E) can be connected to the conducting pattern 124g on the insulating substrate SB21 or the insulating substrate SB22 by the wire 130.

The seventh auxiliary terminal ts7 (T3G) and the conducting pattern 124f on the insulating substrate SB23 are connected by the wire 130. Depending on the position of the seventh auxiliary terminal ts7 (T3G), the seventh auxiliary terminal ts7 (T3G) can be connected to the conducting pattern 124f on the insulating substrate SB21 or the insulating substrate SB23 by the wire 130.

The gate pad of the insulated gate bipolar transistor T2 and the conducting pattern 124b are connected by the wire 130. The emitter of the insulated gate bipolar transistor T2, the anode of the free wheeling diode D2 and the conducting pattern 124c are connected by the wire 130.

The gate pad of the reverse blocking insulated gate bipolar transistor T3 and the conducting pattern 124f are connected by the wire 130. The emitter of the reverse blocking insulated gate bipolar transistor T3 and the conducting pattern 124e are connected by the wire 130.

Moreover, the conducting pattern 124a and the conducting pattern 124c, and further the conducting pattern 124e and the conducting pattern 124g are also connected by the wires 130.

Therefore, as is shown in FIG. 9, on the terminal arranging surface 4 of the case 2, the position at which the sixth auxiliary terminal ts6 (T3E) is arranged and the position at which the eighth auxiliary terminal ts8 (T4E) is arranged are changed with each other in the longitudinal direction of the case 2 from the positions in the first embodiment shown in FIG. 1. Moreover, the position at which the seventh auxiliary terminal ts7 (T3G) is arranged and the position at which the ninth auxiliary terminal ts9 (T4G) is arranged are also changed with each other in the longitudinal direction of the case 2 from the positions shown in FIG. 1.

The other structures are similar to those in the first embodiment. Thus, corresponding parts in FIG. 1 and FIG. 2 are designated by the same reference numerals and signs with detail explanations thereof being omitted.

The second embodiment has the structure in which the arrangement of each of the reverse blocking insulated gate bipolar transistors T3 and the arrangement of each of the reverse blocking insulated gate bipolar transistors T4 in the first embodiment are changed with each other in the longitudinal direction. Therefore, the regions in each of which heat is generated in the foregoing first embodiment are to be of course changed with each other in the longitudinal direction though this is not shown.

FIG. 11 is a view illustrating states of heat generation of the semiconductor devices for each operation mode of the semiconductor system according to the second embodiment of the invention with the states being simplified. In FIG. 11, the insulating substrates SB11 to SB 23 in the regions DA1 to DA4 are represented by cells in a grid and each of the insulated gate bipolar transistors T1 and T2 and the reverse blocking insulated gate bipolar transistors T3 and T4 mounted on its own insulating substrate of the insulating substrates SB11 to SB 23 is shown by a reference numeral in the cell with its heat generating state shown by a hatched pattern.

In a mode in which the insulated gate bipolar transistor T1 is in a switched state and the reverse blocking insulated gate bipolar transistor T4 is brought into recovery, as is shown in (a) of FIG. 11, heat is generated in the regions DA1 and DA4. The amount of the generated heat at this time becomes larger in the region DA1 than the amount in the region DA4.

In a mode in which the insulated gate bipolar transistor T2 is in a switched state and the reverse blocking insulated gate bipolar transistor T3 is brought into recovery, as is shown in (b) of FIG. 11, heat is generated in the regions DA2 and DA3. The amount of the generated heat at this time becomes larger in the region DA2 than the amount in the region DA3.

In a mode in which the reverse blocking insulated gate bipolar transistor T3 is in a switched state and the insulated gate bipolar transistor T1 is brought into recovery, as is shown in (c) of FIG. 11, heat is generated in the region DA1 and the region DA3 positioned diagonally from the region DA1. The amount of the generated heat at this time becomes larger in the region DA3 than the amount in the region DA1 because only the free wheeling diodes D1 generate heat in the region DA1.

In a mode in which the reverse blocking insulated gate bipolar transistor T4 is in a switched state and the insulated gate bipolar transistor T2 is brought into recovery, as is shown in (d) of FIG. 11, heat is generated in the region DA2 and the region DA4 positioned diagonally from the region DA2. The amount of the generated heat at this time becomes larger in the region DA4 than the amount in the region DA2 because only the free wheeling diodes D2 generate heat in the region DA2.

With respect to the positive side conductor plate 21, the negative side conductor plate 22, the intermediate potential conductor plate 23 and the AC output conductor plate 24, no change is found in their arranged positions as is shown in FIG. 10. Thus, like in the foregoing first embodiment, the direction of a current flowing in the intermediate potential conductor plate 23 and the direction of a current flowing in the positive side conductor plate 21 arranged in close proximity thereto become opposite to each other and the direction of a current flowing in the intermediate potential conductor plate 23 and the direction of a current flowing in the negative side conductor plate 22 also become opposite to each other. This can reduce an inductance between the positive side conductor plate 21 and the intermediate potential conductor plate 23 and an inductance between the negative side conductor plate 22 and the intermediate potential conductor plate 23.

Therefore, also in the second embodiment, the inductance in the semiconductor system 1 can be reduced. Moreover, not the whole of the base plate 3 in the semiconductor system 1 produces heat at the same time, but heat generating regions are to be shifted according to operation modes, by which ensured heat dispersion can be carried out to reliably prevent the semiconductor system 1 from being brought into an overheated state.

Figure 12:
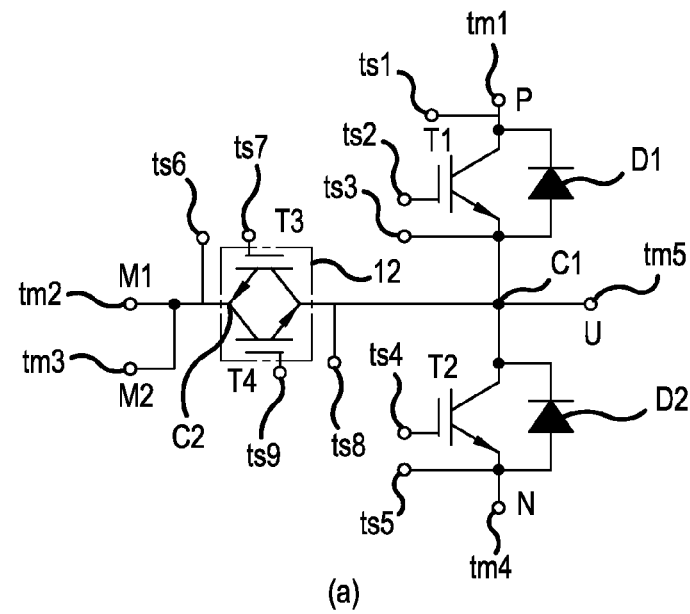
FIG. 12 is a view showing the circuit configuration of an example of the three-level electric power inverter circuit in the second embodiment in (a) and the terminal arrangement thereof in (b)
Figure 12:
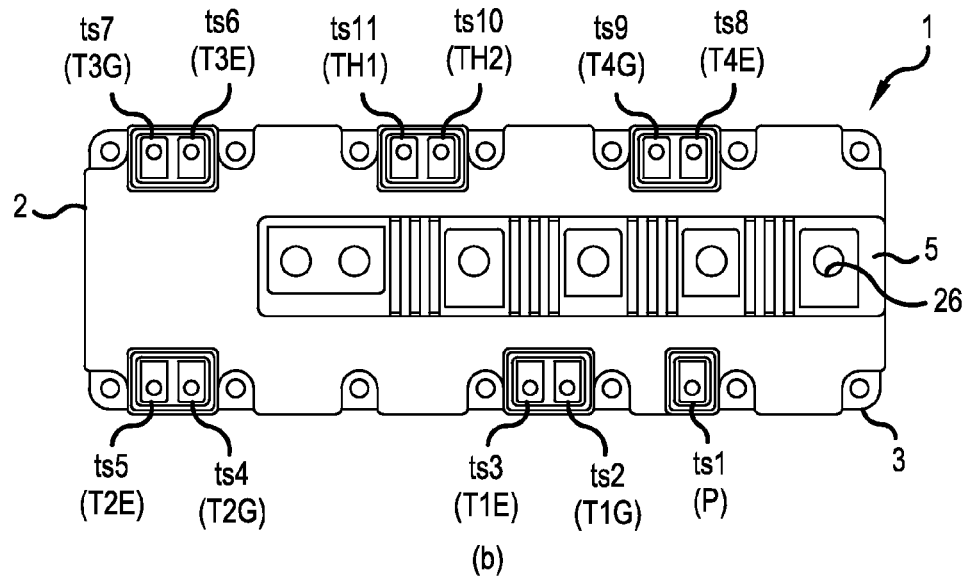
Figure 13:
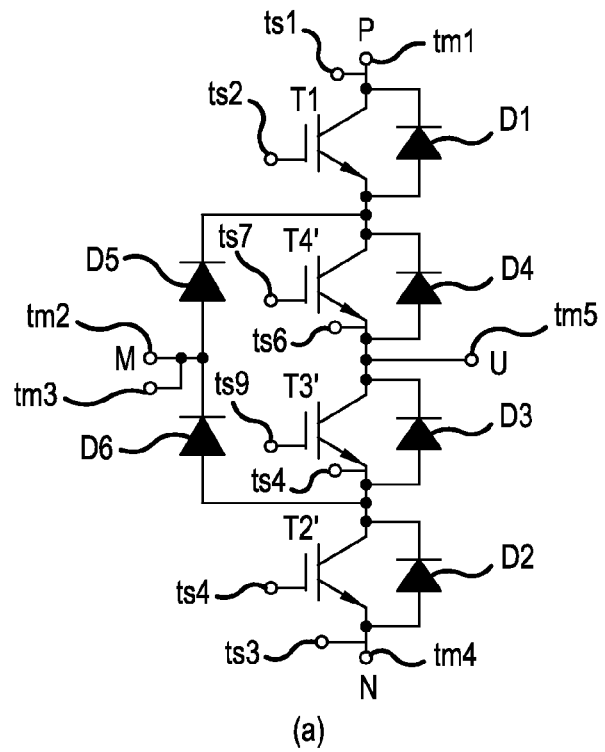
FIG. 13 is a view showing the circuit configuration of another example of the three-level electric power inverter circuit in the second embodiment in (a) and the terminal arrangement thereof in (b)
Figure 13:
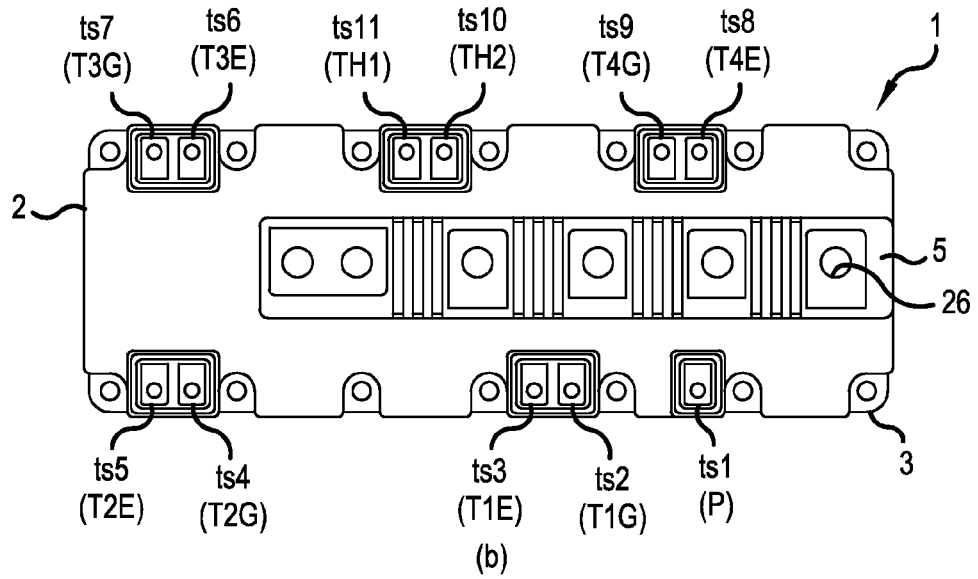

FIG. 12 is a view showing the circuit configuration of an example of the three-level electric power inverter circuit in the second embodiment in (a) and the terminal arrangement thereof in (b). FIG. 13 is a view showing the circuit configuration of another example of the three-level electric power inverter circuit in the second embodiment in (a) and the terminal arrangement thereof in (b).

As was explained in the foregoing, although the terminal arrangement of the case 2 in the example of the three-level electric power inverter circuit in the second embodiment is that to which the terminal arrangement in the first embodiment is changed as is shown in (b) of FIG. 12, the circuit configuration shown in (a) of FIG. 12 is kept to be identical to the circuit configuration in the first embodiment shown in FIG. 3.

In addition, in the second embodiment, even though the circuit configuration of the three-level electric power inverter circuit is changed from the circuit configuration shown in foregoing FIG. 12 (a), using the reverse blocking insulated gate bipolar transistors T3 and T4, to the circuit configuration of another example shown in FIG. 13 (a) using the insulated gate bipolar transistors T3' and T4' by substituting the internal wiring patterns, the same AC output voltage can be obtained in the same operation mode with the terminal arrangement of the case 2 shown in FIG. 13(b) being kept to be the same as that shown in FIG. 12(b).

Namely, to the three-level electric power inverter circuit shown in FIG. 13 (a), instead of the reverse blocking insulated gate bipolar transistors T3 and T4 shown in FIG. 12(a), the insulated gate bipolar transistors T3' and T4' corresponding thereto are applied with free wheeling diodes D3 and D4 connected in inverse parallel thereto, respectively.

Moreover, to the emitter of the insulated gate bipolar transistor T1 with the free wheeling diodes D1 connected in inverse parallel thereto, which transistor is identical to that used in the circuit shown in (a) of FIG. 12, the collector of the insulated gate bipolar transistor T4' with the free wheeling diodes D4 connected in inverse parallel thereto is connected. Further, the emitter of the insulated gate bipolar transistor T4' is connected to the collector of the insulated gate bipolar transistor T3' with the free wheeling diodes D3 connected in inverse parallel thereto. To the connection point of the emitter of the insulated gate bipolar transistor T4' and the collector of the insulated gate bipolar transistor T3', the fifth external connection terminal tm5 (U) is further connected.

In addition, the emitter of the insulated gate bipolar transistor T3' is connected to the collector of the insulated gate bipolar transistor T2 with the free wheeling diodes D2 connected in inverse parallel thereto.

Further, to the connection point of the emitter of the insulated gate bipolar transistor T1 and the collector of the insulated gate bipolar transistor T4', the cathode of a diode D5 is connected. The anode of the diode D5 is connected to the cathode of a diode D6 and the anode of the diode D6 is connected to the connection point of the emitter of the insulated gate bipolar transistor T3' and the collector of the insulated gate bipolar transistor T2. To the connection point of the anode of the diode D5 and the cathode of a diode D6, the second external connection terminal tm2 (M1) and the third external connection terminal tm3 (M2) are connected.

Figure 14:
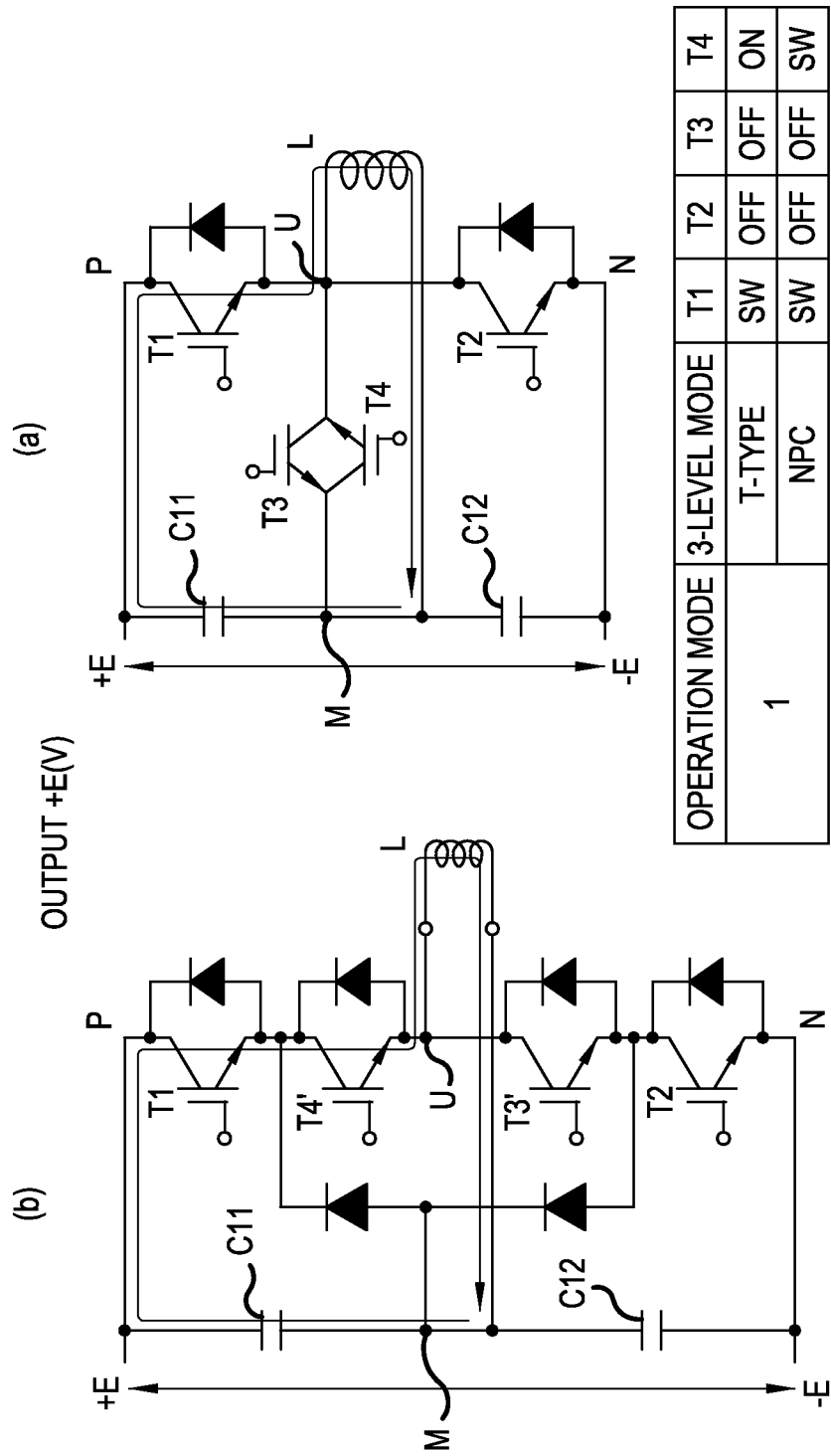
FIG. 14 is a view showing a comparison between the current path in the circuit configuration shown in (a) of FIG. 12 and the current path in the circuit configuration shown in (a) of FIG. 13 in a state of outputting a positive voltage in the second embodiment.

FIG. 14 is a view showing a comparison between the current path in the circuit configuration shown in (a) of FIG. 12 and the current path in the circuit configuration shown in (a) of FIG. 13 in a state of outputting a positive voltage in the second embodiment In this case, in the three-level electric power inverter circuits shown in (a) of FIG. 12 and (a) of FIG. 13 having circuit configurations different from each other, in a first operation mode in which the DC voltage +E(V) charging a capacitor C 11 becomes the voltage outputted from the fifth external connection terminal tm5 (U) as is shown in FIG. 14, the circuit with the configuration shown in (a) of FIG. 12 has the insulated gate bipolar transistor T1 made to carryout a switching operation, the reverse blocking insulated gate bipolar transistor T4 made turned-on, and the insulated gate bipolar transistor T2 and the reverse blocking insulated gate bipolar transistor T3 made turned off as is shown in (a) of FIG. 14. While, the circuit with the configuration shown in (a) of FIG. 13 has the insulated gate bipolar transistor T1 made to carry-out a switching operation, the insulated gate bipolar transistor T4' made turned-on, and the insulated gate bipolar transistor T2 and the insulated gate bipolar transistor T3' made turned off as is shown in (b) of FIG. 14.

In this case, the path of a current flowing in the three-level electric power inverter circuit with the configuration shown in (a) of FIG. 12 becomes a path starting from the positive electrode side of the capacitor C11 and returning to the negative electrode side of the capacitor C11 through the insulated gate bipolar transistor T1 and through an inductive load L. Thus, the output voltage of +E(V) is applied to the inductive load L.

Compared with this, the path of a current flowing in the three-level electric power inverter circuit with the configuration shown in (a) of FIG. 13 becomes a path starting from the positive electrode side of the capacitor C11 and returning to the negative electrode side of the capacitor C11 through the insulated gate bipolar transistors T1 and T4' and through an inductive load L. Thus, the output voltage of +E(V) is applied to the inductive load L.

Therefore, by giving the same kinds of gate signals to the four insulated gate bipolar transistors T1 to T4 in the circuit with the configuration shown in (a) of FIG. 12 and to the four insulated gate bipolar transistors T1 to T4' in the circuit with the configuration shown in (a) of FIG. 13, the same output voltages are to be outputted.

Figure 15:
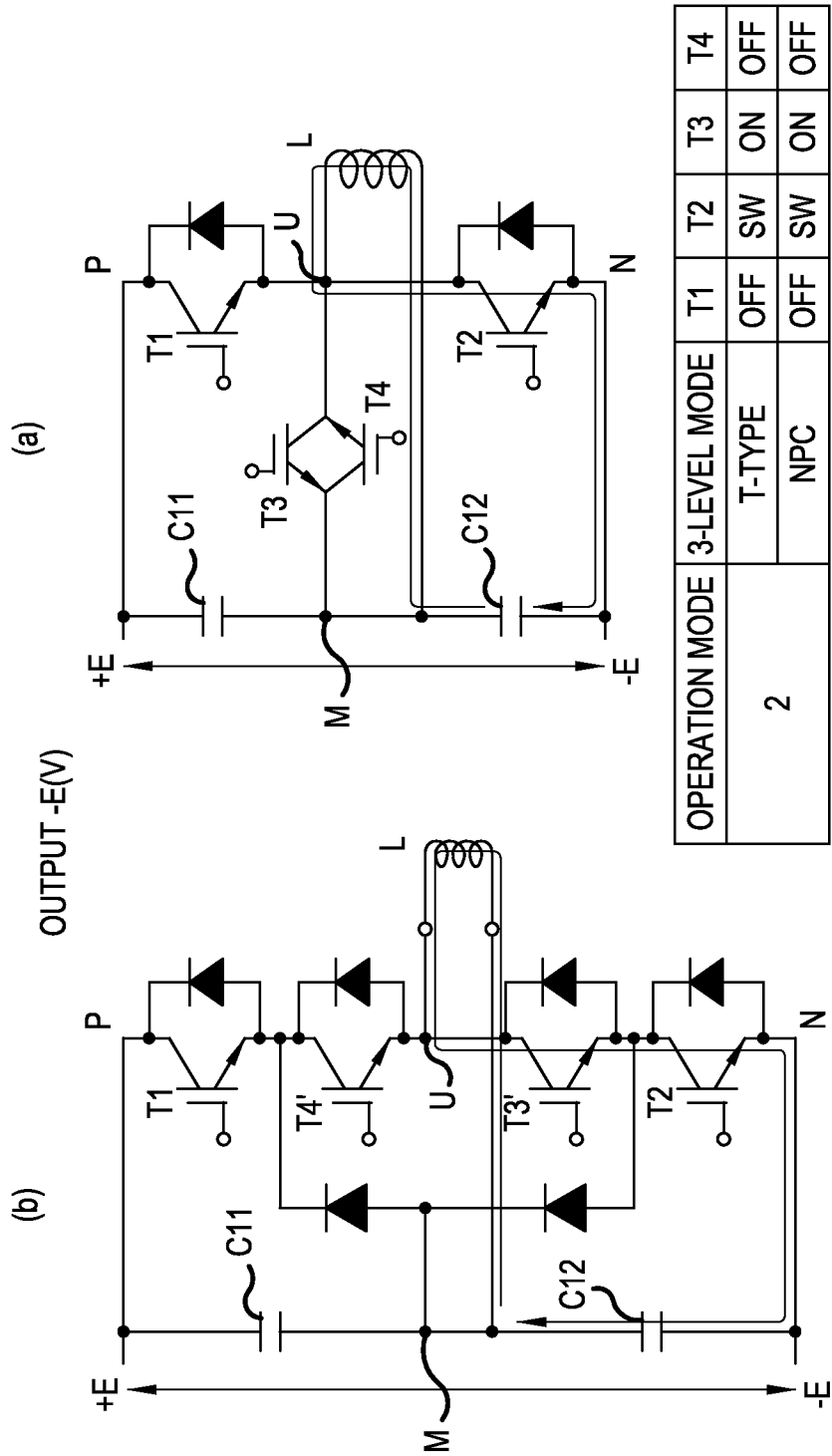
FIG. 15 is a view showing a comparison between the current path in the circuit configuration shown in (a) of FIG. 12 and the current path in the circuit configuration shown in (a) of FIG. 13 in a state of outputting a negative voltage in the second embodiment.

FIG. 15 is a view showing a comparison between the current path in the circuit configuration shown in (a) of FIG. 12 and the current path in the circuit configuration shown in (a) of FIG. 13 in a state of outputting a negative voltage in the second embodiment.

Contrary to the foregoing, in a second operation mode in which the DC voltage −E(V) charging a capacitor C 12 becomes the voltage outputted from the fifth external connection terminal tm5 (U), as is shown in FIG. 15, the circuit with the configuration shown in (a) of FIG. 12 has the insulated gate bipolar transistor T2 made to carryout a switching operation, and has a gate signal inputted that makes the reverse blocking insulated gate bipolar transistor T3 turned-on. With respect to the rest insulated gate bipolar transistor T1 and reverse blocking insulated gate bipolar transistor T4, gate signals bringing the transistors T1 and T4 into turned-off states, respectively, are inputted.

In this case, the path of a current flowing in the three-level electric power inverter circuit with the configuration shown in (a) of FIG. 12 becomes, as is shown in (a) of FIG. 15, a path starting from the positive electrode side of the capacitor C12 and returning to the negative electrode side of the capacitor C12 through the inductive load L and through the insulated gate bipolar transistor T2. Thus, the output voltage of −E(V) can be applied to the inductive load L.

Compared with this, the path of a current flowing in the three-level electric power inverter circuit with the configuration shown in (a) of FIG. 13 becomes, as is shown in (b) of FIG. 15, a path starting from the positive electrode side of the capacitor C12 and returning to the negative electrode side of the capacitor C12 through the inductive load L and through the insulated gate bipolar transistors T3' and the insulated gate bipolar transistor T2. Thus, the output voltage of −E(V) can be applied to the inductive load L.

Also in this case, by giving the same kinds of gate signals to the four insulated gate bipolar transistors T1 to T4 in the circuit with the configuration shown in (a) of FIG. 12 and to the four insulated gate bipolar transistors T1 to T4' in the circuit with the configuration shown in (a) of FIG. 13, the same output voltages are to be outputted.

Figure 16:
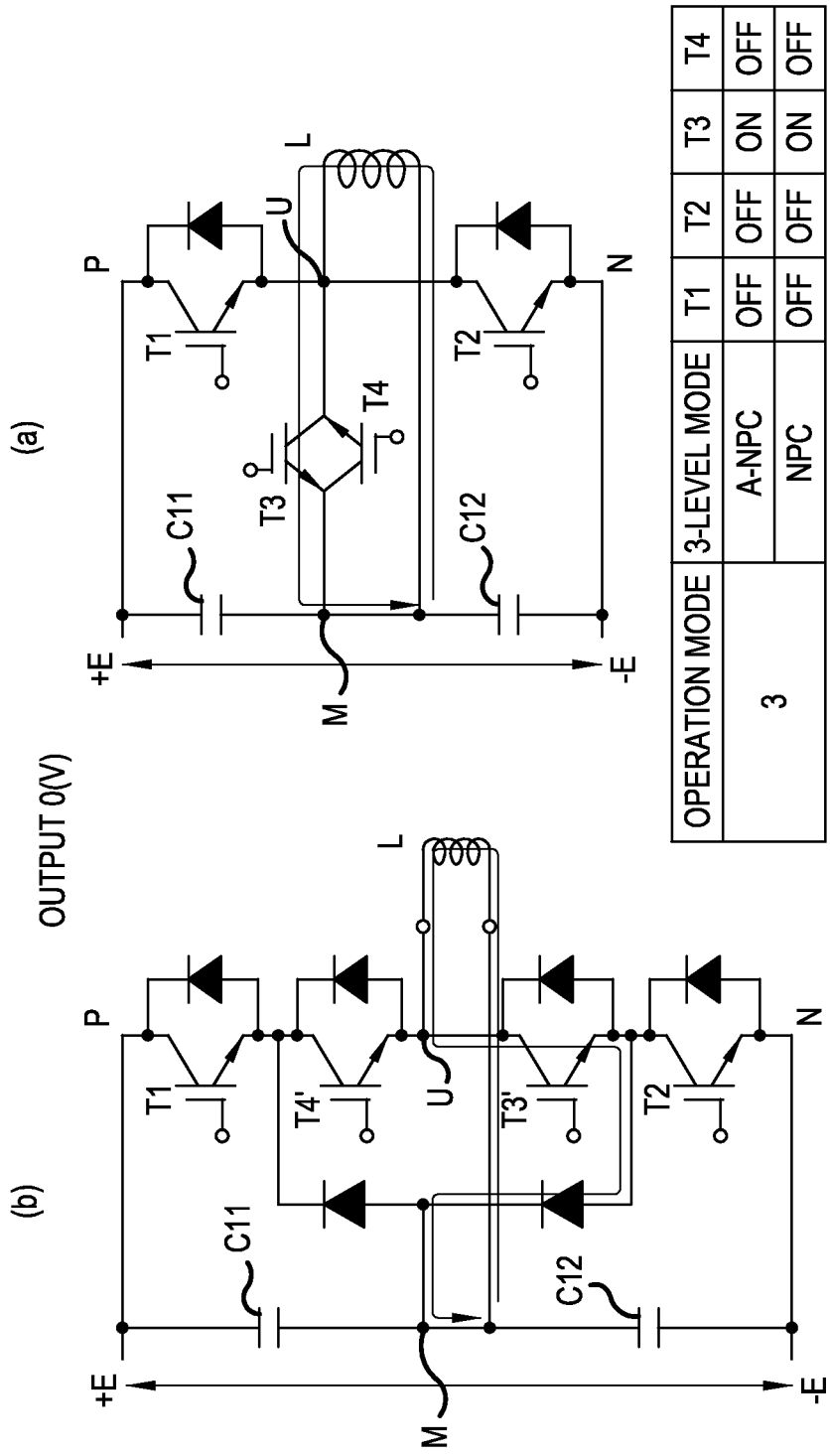
FIG. 16 is a view showing a comparison between the current path in the circuit configuration shown in (a) of FIG. 12 and the current path in the circuit configuration shown in (a) of FIG. 13 in a state of outputting a zero voltage in the second embodiment.

Furthermore, in a third operation mode in which the output voltage of the fifth external connection terminal tm5 (U) is made to be zero, as is shown in FIG. 16, a gate signal bringing the reverse blocking insulated gate bipolar transistor T3 into a turned-on state is inputted and gate signals bringing all of the other insulated gate bipolar transistors T1, T2 and the reverse blocking insulated gate bipolar transistor T4 into turned-off states are inputted.

FIG. 16 is a view showing a comparison between the current path in the circuit configuration shown in (a) of FIG. 12 and the current path in the circuit configuration shown in (a) of FIG. 13 in a state of outputting a zero voltage in the second embodiment.

In this case, the path of a current flowing in the three-level electric power inverter circuit with the configuration shown in (a) of FIG. 12 becomes, as is shown in (a) of FIG. 16, a path starting from the connection point between the capacitors C11 and C12 and returning to the connection point between the capacitors C11 and C12 through the inductive load L and through the reverse blocking insulated gate bipolar transistor T3. Thus, the output voltage applied to the inductive load L becomes 0 (V).

While, the path of a current flowing in the three-level electric power inverter circuit with the configuration shown in (a) of FIG. 13 becomes, as is shown in (b) of FIG. 16, a path starting from the connection point between the capacitors C11 and C12 and returning to the connection point between the capacitors C11 and C12 through the inductive load L, through the insulated gate bipolar transistor T3' and through the diode D6. Thus, the output voltage applied to the inductive load L becomes 0 (V).

Therefore, also in the third operation mode, by giving the same kinds of gate signals to the four insulated gate bipolar transistors T1 to T4 in the circuit with the configuration shown in (a) of FIG. 12 and to the four insulated gate bipolar transistors T1 to T4' in the circuit with the configuration shown in (a) of FIG. 13, the same output voltages are to be outputted.

In this way, even in the case in which configurations of three-level electric power inverter circuits contained in the semiconductor system 1 are different, with the arranged positions of the first external connection terminal tm1 to the fifth external connection terminal tm5 and the first auxiliary terminal ts1 to the eleventh auxiliary terminals ts11 being made in common to the configurations of the circuits, the same output signals are to be obtained for the same kinds of gate signals in each operation mode. Therefore, a user can use without any concern for the configuration of a three-level electric power inverter circuit contained in the semiconductor system 1, by which a semiconductor system with high compatibility can be provided.

In the next, a third embodiment of the invention will be explained with reference to FIG. 17 and FIG. 18.

Figure 17:
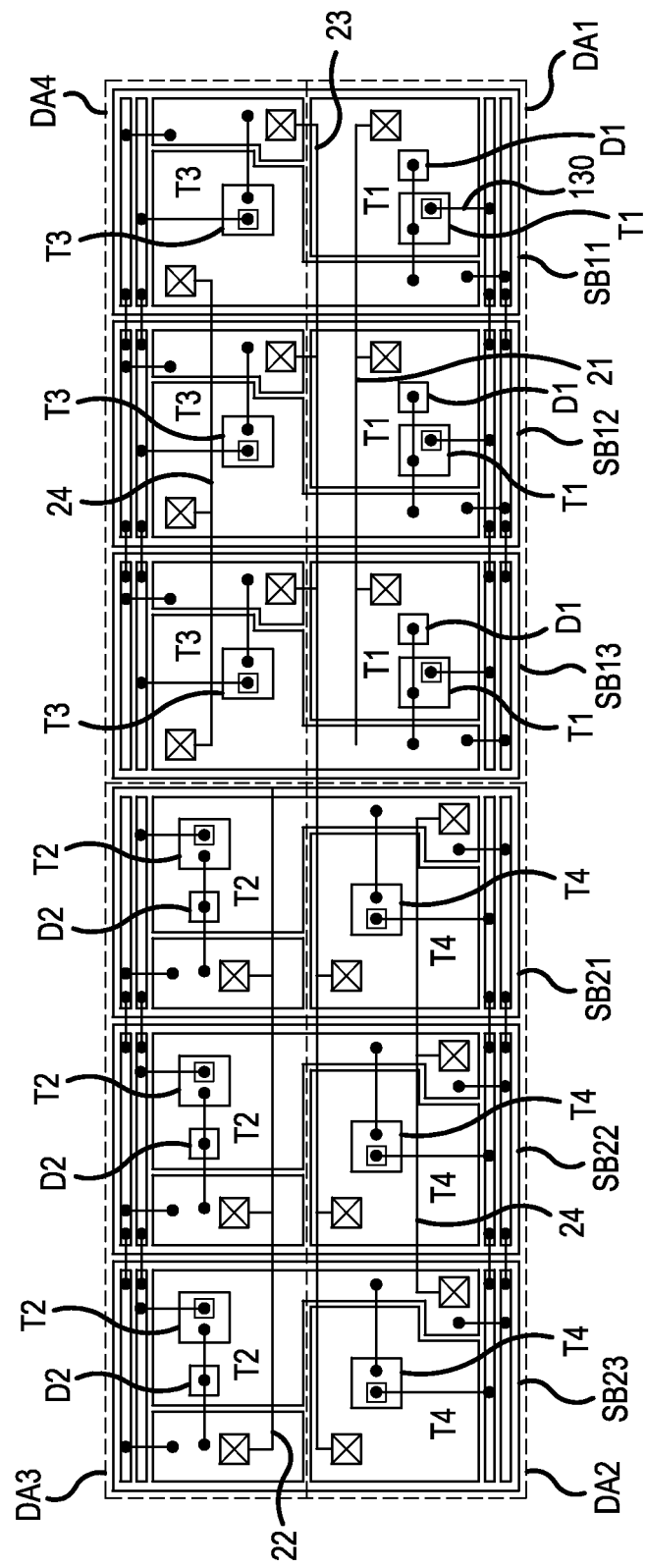
FIG. 17 is a plan view showing insulating substrates on which semiconductor devices are mounted in the semiconductor system according to the third embodiment of the invention.

FIG. 17 is a plan view showing insulating substrates on which semiconductor devices are mounted in the semiconductor system according to the third embodiment of the invention. The base plate 3 and the first auxiliary terminal ts1 to the eleventh auxiliary terminal ts11 shown in FIG. 2 are omitted to be shown in the drawing. In the third embodiment, the insulated gate bipolar transistors T1 and T3 each generating the largest amount of heat in the first embodiment are to be arranged diagonally from each other Namely, the third embodiment, as is shown in FIG. 17, has a configuration in which the insulated gate bipolar transistors T2, which were arranged in the region DA2 in the arrangement shown in FIG. 2 in the foregoing first embodiment, are arranged in the region DA3 of the insulating substrates SB21 to SB23 and the reverse blocking insulated gate bipolar transistors T4, which were arranged in the region DA3, are arranged in the region DA2 of the insulating substrates SB21 to SB23.

According to the change in arrangement, the arrangements of the negative side conductor plate 22 and the AC output conductor plate 24 to the intermediate potential conductor plate 23 are changed.

Namely, although the arrangements of the intermediate potential conductor plate 23 and the positive side conductor plate 21 are identical to the foregoing arrangements in the foregoing first embodiment, the negative side conductor plate 22 is arranged in the region DA3 to face the rear side of the intermediate potential conductor plate 23 in proximity thereto. Furthermore, the AC output conductor plate 24 is divided into two to be arranged in their respective regions DA2 and DA4.

The other structures are similar to those in the first embodiment. Thus, corresponding parts in FIG. 2 are designated by the same reference numerals and signs with detail explanations thereof being omitted.

According to the third embodiment, the positive side conductor plate 21 is arranged to face the front side of the intermediate potential conductor plate 23 in proximity thereto and the negative side conductor plate 22 is arranged to face the rear side of the intermediate potential conductor plate 23 in proximity thereto. This makes the direction of a current flowing in the intermediate potential conductor plate 23 and the direction of a current flowing in the positive side conductor plate 22 become opposite to each other and makes the direction of a current flowing in the intermediate potential conductor plate 23 and the direction of a current flowing in the negative side conductor plate 22 become opposite to each other, by which an inductance between the intermediate potential conductor plate 23 and the positive side conductor plate 21 and an inductance between the intermediate potential conductor plate 23 and the negative side conductor plate 22 can be reduced as was described in the foregoing.

Moreover, by changing the arrangement of the insulated gate bipolar transistors T2 and the arrangement of the reverse blocking insulated gate bipolar transistor T4, the conducting patterns are also changed.

With respect to heat generation, in the third embodiment, since the insulated gate bipolar transistors T2, which were arranged in the region DA2 in the foregoing first embodiment, are changed to be arranged in the region DA3 and the reverse blocking insulated gate bipolar transistors T4, which were arranged in the region DA3, are changed to be arranged in the region DA2, the state of heat generation in each operation mode becomes as is shown in each of (a) to (d) with the state being simplified.

Namely, when an operation is in a mode in which a gate pulse is inputted to each of the gates of the insulated gate bipolar transistors T1 to switch the transistors T1 with the reverse blocking insulated gate bipolar transistors T4 being brought into a recovery state, the insulated gate bipolar transistors T1 mounted on the insulating substrates SB11 to SB13 arranged in the region DA1 and the reverse blocking insulated gate bipolar transistors T4 mounted on the insulating substrates SB21 to SB23 in the region DA2 adjacent on the left side to the region DA1 are to generate heat as is shown by hatch patterns in (a) of FIG. 18. While, in the regions DA3 and DA4, no heat is generated.

Moreover, when an operation is in a mode in which a gate pulse is supplied to each of the gates of the insulated gate bipolar transistors T2 to switch the transistors T2 with the reverse blocking insulated gate bipolar transistors T3 being brought into a recovery state, the insulated gate bipolar transistors T2 mounted on the insulating substrates SB21 to SB23 arranged in the region DA3 and the reverse blocking insulated gate bipolar transistors T3 mounted on the insulating substrates SB11 to SB13 in the region DA4 adjacent on the right side to the region DA3 are to generate heat as is shown by hatch patterns in (b) of FIG. 18. While, in the regions DA1 and DA2, no heat is generated.

Furthermore, when an operation is in a mode in which a gate pulse is supplied to each of the gates of the reverse blocking insulated gate bipolar transistors T3 to switch the transistors T3 with the insulated gate bipolar transistors T1 being brought into a recovery state, the free wheeling diodes D1 mounted on the insulating substrates SB11 to SB13 in the region DA1 generate heat and, along with this, the reverse blocking insulated gate bipolar transistors T3 mounted on the insulating substrates SB11 to SB13 in the region DA4 on the rear side of the region DA1 are to generate heat as is shown by hatch patterns in (c) of FIG. 18. While, in the regions DA2 and DA3, no heat is generated.

In addition, when an operation is in a mode in which a gate pulse is supplied to each of the gates of the reverse blocking insulated gate bipolar transistors T4 to switch the transistors T4 with the insulated gate bipolar transistors T2 being brought into recovery, the reverse blocking insulated gate bipolar transistors T4 mounted on the insulating substrates SB21 to SB23 in the region DA2 on the rear side of the region DA1 generate heat and, along with this, the free wheeling diodes D1 in the region DA3 adjacent to the region DA2 on the rear side thereof generate heat as is shown by hatch patterns in (d) of FIG. 18. While, in the regions DA1 and DA4, no heat is generated.

In this way, according to the third embodiment, when the semiconductor system 1 is brought into an operating state, like in the foregoing first embodiment, heat is not generated in all of the regions DA1 to DA4 but is generated only in two regions positioned so as to be adjacent to each other in the longitudinal direction or in two regions positioned so as to be adjacent to each other in the lateral direction. That is, heat is generated only in partial two regions according to an operation mode.

Therefore, compared with the case in which heat is generated in the whole insulating substrates on the base plate like in the foregoing examples of the related modules, generated heat can be dispersed to enable the semiconductor system 1 to be reliably prevented from being brought into an overheated state.

In the third embodiment, the case was explained in which the insulated gate bipolar transistors T2 and the reverse blocking insulated gate bipolar transistors T4 arranged in the region DA2 and the region DA3, respectively, in the foregoing first embodiment are changed so that the transistors T2 and T4 are arranged in the region DA3 and the region DA2, respectively. The invention, however is not limited to the foregoing configuration, but the configuration can be modified into that in which the reverse blocking insulated gate bipolar transistor T4 and the reverse blocking insulated gate bipolar transistor T3 arranged in the region DA2 and the region DA4, respectively, can be changed in the third embodiment so as to be arranged in the region DA4 and the region DA2, respectively, as is shown in FIG. 19 and FIG. 20.

Figure 19:
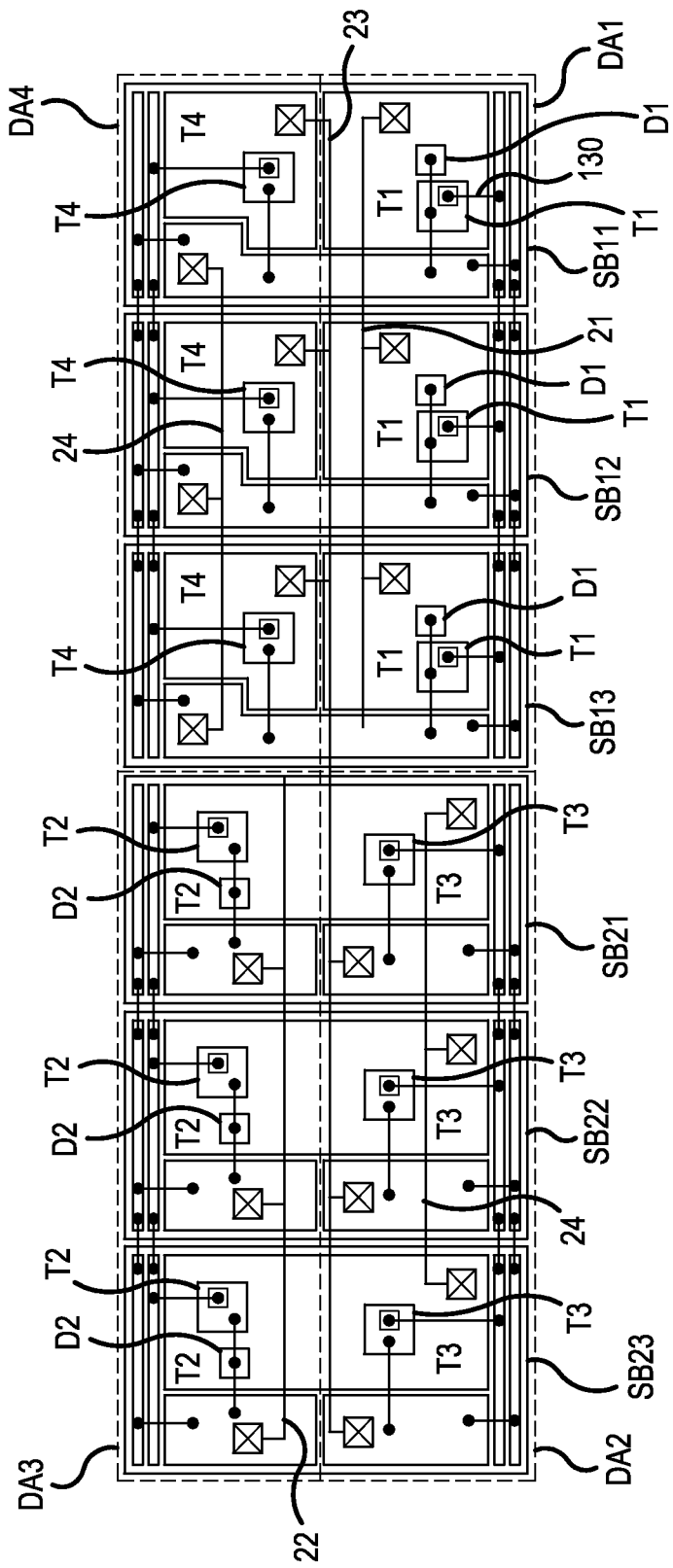
FIG. 19 is a plan view showing insulating substrates on which semiconductor devices are mounted in an example of a modification of the semiconductor system according to the third embodiment of the invention.

FIG. 19 is a plan view showing insulating substrates on which semiconductor devices are mounted in an example of a modification of the semiconductor system according to the third embodiment of the invention and FIG. 20 is a view illustrating states of heat generation of the semiconductor devices for each operation mode in the example of the modification of the semiconductor system according to the third embodiment of the invention with the states being simplified.

In the case of the example of the modification, although a detailed explanation is omitted, the relations among the positive side conductor plate 21, negative side conductor plate 22, intermediate potential conductor plate 23 and AC output conductor plate 24 in the arrangements thereof are identical to those in the foregoing third embodiment, by which the effect of reduction in inductance can be exhibited. Moreover, the state of heat generation in each of the modes shown in (a) to (d) of FIG. 18 becomes the state as is shown in each of the modes shown in (a) to (d) of FIG. 20. This makes, like in the foregoing third embodiment, heat to be generated in two regions positioned so as to be adjacent to each other in the lateral direction and in two regions positioned so as to be adjacent to each other in the longitudinal direction, by which a working-effect similar to those in the foregoing first to third embodiments can be obtained.

In the next, a fourth embodiment of the invention will be explained with reference to FIG. 21 and FIG. 22.

Figure 21:
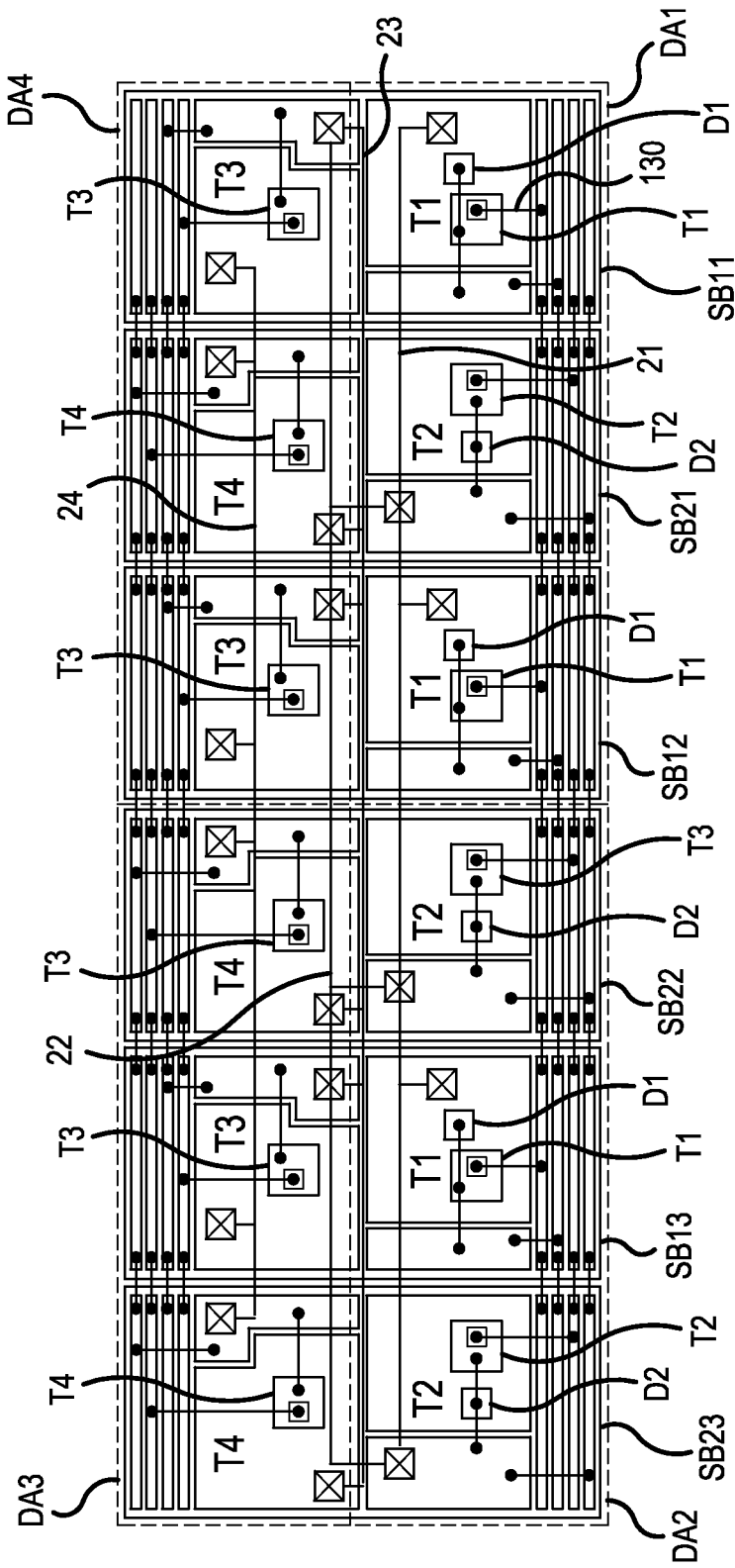
FIG. 21 is a plan view showing insulating substrates on which semiconductor devices are mounted in the semiconductor system according to the fourth embodiment of the invention.

FIG. 21 is a plan view showing insulating substrates on which semiconductor devices are mounted in the semiconductor system according to the fourth embodiment of the invention. The base plate 3 and the first auxiliary terminal ts1 to the eleventh auxiliary terminal ts11 shown in FIG. 2 are omitted to be shown in the drawing.

In the foregoing first to third embodiments, three identical insulating substrates SB11 to SB13, on each of which the insulated gate bipolar transistors T1 and T3 or T1 and T4 of the four insulated gate bipolar transistors T1 to T4 forming a three-level electric power inverter circuit are surface mounted, are arranged to be adjacent to one another and three identical insulating substrates SB21 to SB23, on each of which the insulated gate bipolar transistors T2 and T4 or T2 and T3 of the four insulated gate bipolar transistors T1 to T4 are surface mounted, are arranged to be adjacent to one another, which makes transistors of the same functions with the same reference numerals of reference characters of the transistors T1 to T4 arranged to be adjacent to one another. In the fourth embodiment, however, unlike the first to third embodiments, the insulating substrates SB11 to SB13 and the insulating substrates SB21 to SB23 are not arranged to be adjacent to one another but are alternately arranged in order of the reference numerals of reference characters from the right as SB11, SB21, SB12, SB22, SB13 and SB23 so that the transistors T1 and T2 are alternately arranged without being made to be adjacent to one another and the transistors T3 and T4 are alternately arranged without being made to be adjacent to one another as is shown in FIG. 21.

In this case, as is shown in FIG. 21, the intermediate potential conductor plate 23 and the AC output conductor plate 24 are arranged in the same way as in the foregoing first embodiment. Compared with this, the positive side conductor plate 21 faces the intermediate potential conductor plate 23 in close proximity thereto over approximately the whole length thereof from the front side. While, from the rear side of the intermediate potential conductor plate 23, the negative side conductor plate 22 faces the conductor plate 23 in close proximity thereto over approximately the whole length thereof.

This allows the areas of the intermediate potential conductor plate 23 and the positive side conductor plate 21 facing each other in each of which a current flows in the direction opposite to the direction of the current flowing in the other and the areas of the intermediate potential conductor plate 23 and the negative side conductor plate 22 facing each other in each of which a current flows in the direction opposite to the direction of the current flowing in the other to be made wider than those in the first embodiment, by which the effect of inductance reduction can be better exhibited.

Figure 22:
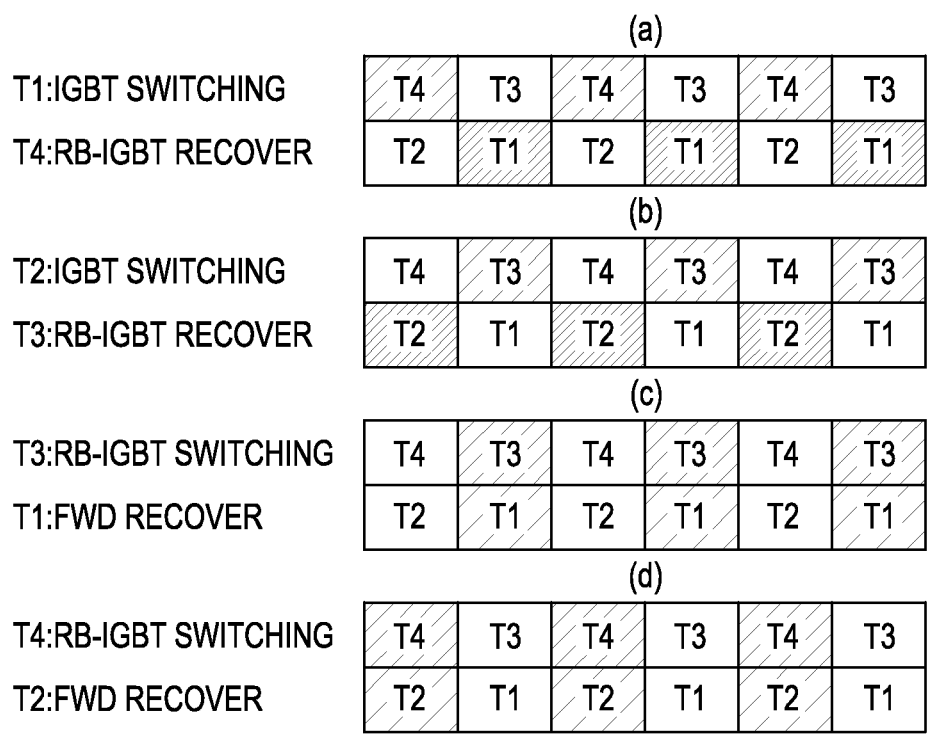
FIG. 22 is a view illustrating states of heat generation of the semiconductor devices for each operation mode of the semiconductor system according to the fourth embodiment of the invention with the states being simplified.

FIG. 22 is a view illustrating states of heat generation of the semiconductor devices for each operation mode of the semiconductor system according to the fourth embodiment of the invention with the states being simplified. Although a detailed explanation is omitted, when an operation is in a mode in which the insulated gate bipolar transistor T2 is in a switched state and the reverse blocking insulated gate bipolar transistor T1 is brought into recovery, as is shown in (a) of FIG. 22, heat is generated in a zigzag pattern.

When an operation is in a mode in which the insulated gate bipolar transistor T2 is in a switched state and the reverse blocking insulated gate bipolar transistor T3 is brought into recovery, as is shown in (b) of FIG. 22, heat is generated in a zigzag pattern in which the zigzag pattern shown in (a) of FIG. 22 is laterally reversed.

Further, when an operation is in a mode in which the reverse blocking insulated gate bipolar transistor T3 is in a switched state and the insulated gate bipolar transistor T1 is brought into recovery, as is shown in (c) of FIG. 22, heat is generated in two regions in every other insulating substrate.

Still further, when an operation is in a mode in which the reverse blocking insulated gate bipolar transistor T4 is in a switched state and the insulated gate bipolar transistor T2 is brought into recovery, as is shown in (d) of FIG. 22, heat is generated in two regions in every other insulating substrate in which regions no heat is generated in the mode shown in (c) of FIG. 22.

Therefore, also in the fourth embodiment, the inductance in the semiconductor system 1 can be reduced. Moreover, not the whole of the base plate 3 in the semiconductor system 1 produces heat at the same time, but heat generating regions are to be shifted according to operation modes, by which ensured heat dispersion can be carried out to reliably prevent the semiconductor system 1 from being brought into an overheated state.

Figure 23:
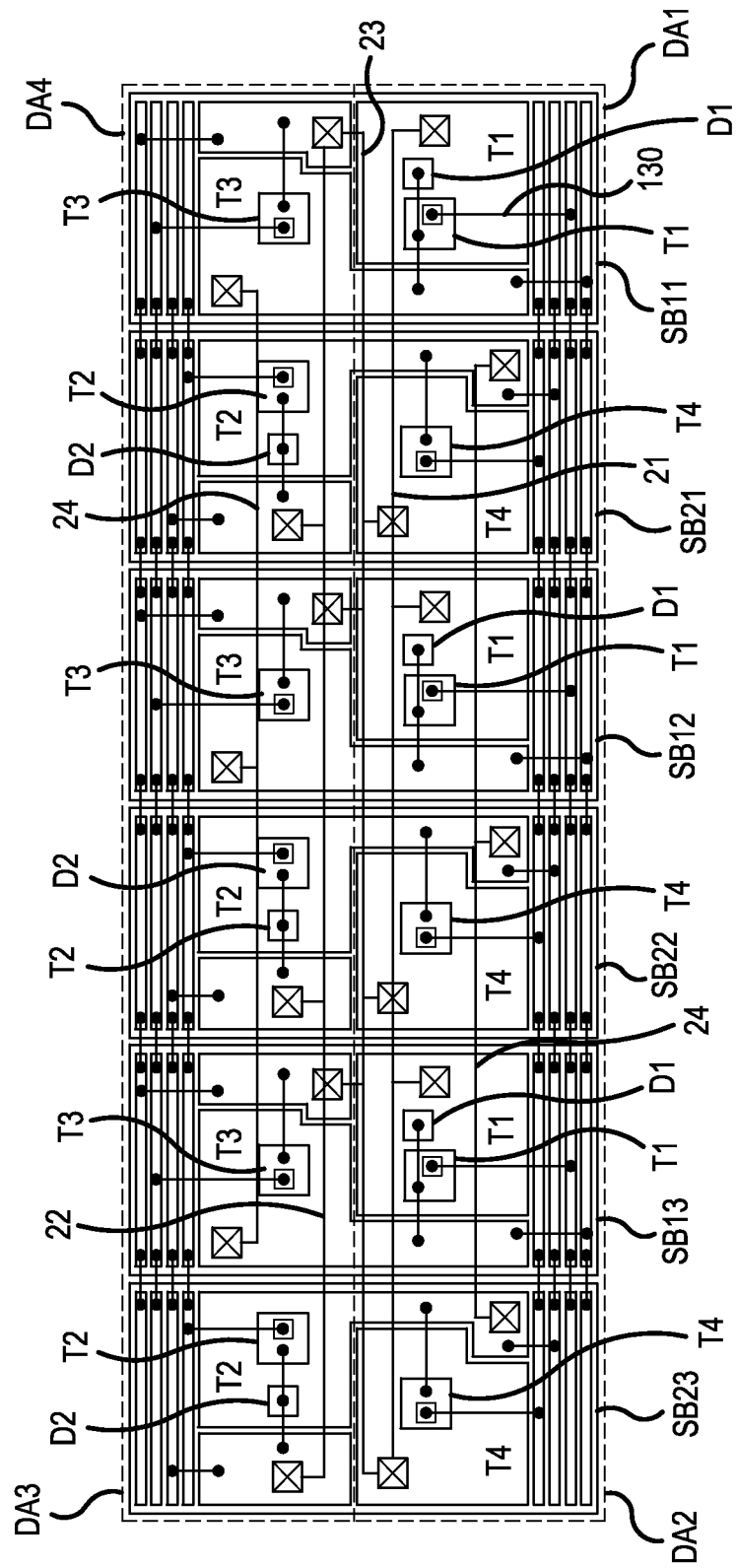
FIG. 23 is a plan view showing insulating substrates on which semiconductor devices are mounted in an example of a modification of the semiconductor system according to the fourth embodiment of the invention.

FIG. 23 is a plan view showing insulating substrates on which semiconductor devices are mounted in an example of a modification of the semiconductor system according to the fourth embodiment of the invention and FIG. 24 is a view illustrating states of heat generation of the semiconductor devices for each operation mode in the example of the modification of the semiconductor system according to the fourth embodiment of the invention with the states being simplified. Namely, in the fourth embodiment, as is shown in FIG. 23 and FIG. 24, the lateral arrangements of the insulated gate bipolar transistor T2 and the reverse blocking insulated gate bipolar transistor T4 on each of the insulating substrates SB21 to SB23 can be also changed. In this case, the state of heat generation becomes a mixed state of the state of heat generation in the foregoing third embodiment and the state of heat generation in the fourth embodiment, by which a working-effect similar to those in the foregoing first to fourth embodiments can be obtained.

In each of the foregoing first to fourth embodiments, the case of arranging three sets of insulating substrates each of which sets mounts the insulated gate bipolar transistors T1 and T2 and the reverse blocking insulated gate bipolar transistors T3 and T4 or the insulated gate bipolar transistors T1, T2, T3' and T4'. The invention, however, is not limited to this, but the number of sets of the insulating substrates can be arbitrarily determined depending on required current capacity.

Figure 25:
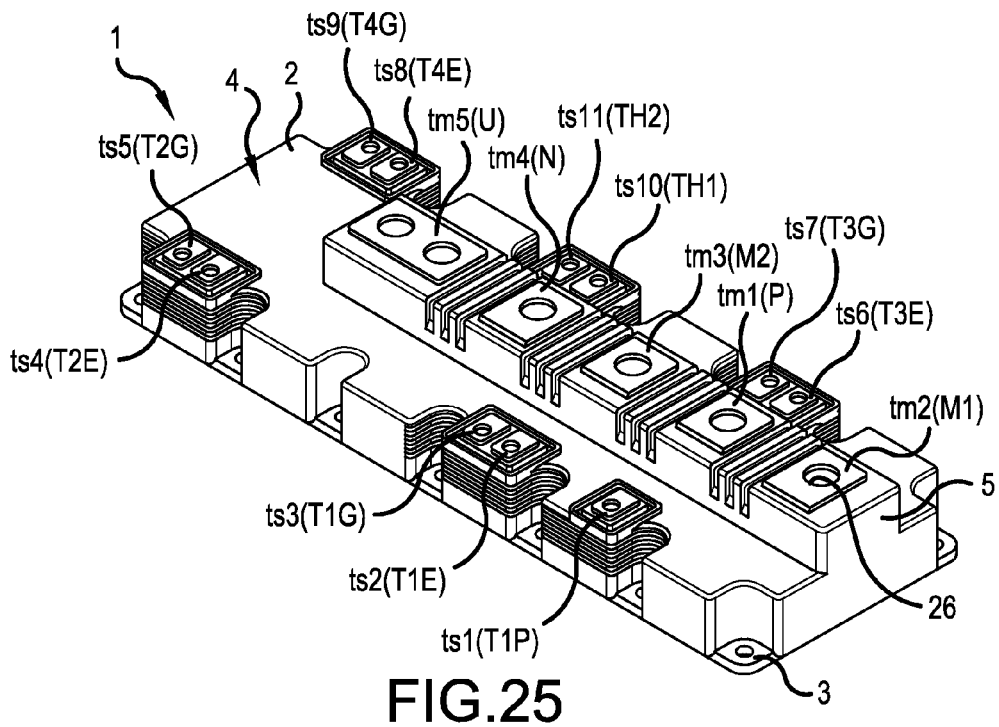
FIG. 25 is a perspective view showing an example of a modification of a semiconductor system corresponding to the semiconductor system according to the first embodiment of the invention shown in FIG. 1 with the arranged positions of two external connection terminals being changed to each other.

Moreover, in each of the foregoing first to fourth embodiments, the case is explained in which the first external connection terminal tm1 (P) to the fifth external connection terminal tm5 (U) are provided with the positions thereof being fixed in the case 2. The invention, however, is not limited to this. FIG. 25 is a perspective view showing an example of a modification of a semiconductor system corresponding to the semiconductor system according to the first embodiment of the invention shown in FIG. 1 with the arranged positions of two external connection terminals being changed to each other. Namely, as is shown in FIG. 25, the arranged position of the first external connection terminal tm1 (P) and the arranged position of the second external connection terminal tm2 (M1) can be changed to each other.

Figure 26:
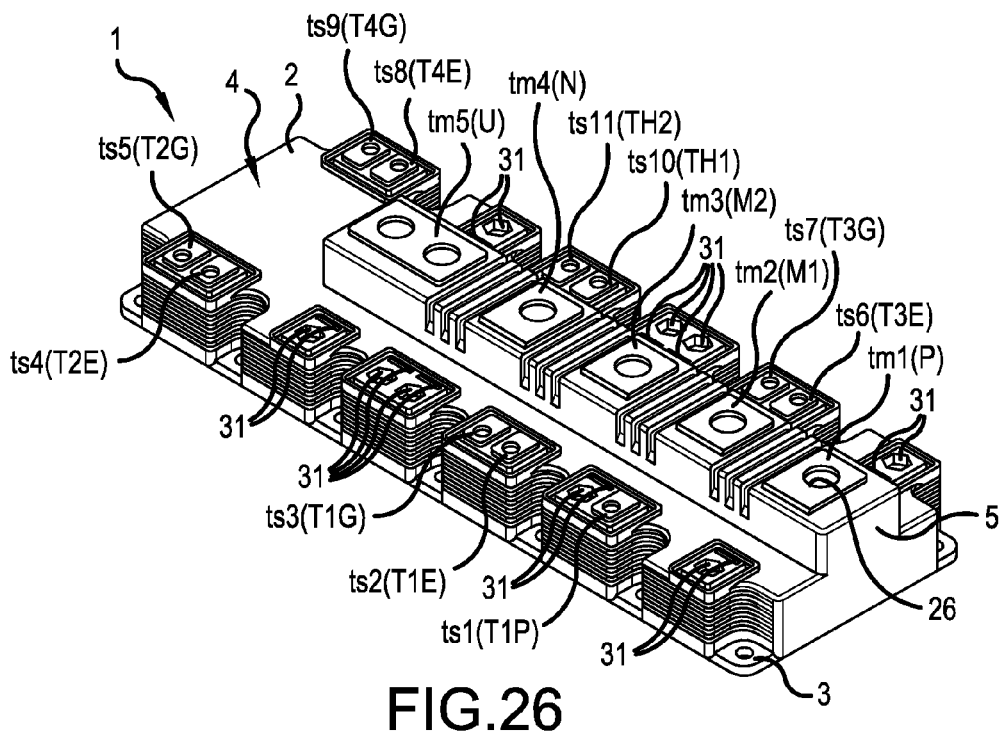
FIG. 26 is a perspective view showing an example of another modification of the semiconductor system corresponding to the semiconductor system according to the first embodiment of the invention shown in FIG. 1.

Furthermore, in each of the foregoing first to fourth embodiments, the case is explained in which the external connection terminals and the auxiliary terminals are provided with the numbers required for each of the three-level electric power inverter circuits contained in the case 2. The invention, however, is not limited to this. FIG. 26 is a perspective view showing an example of another modification of the semiconductor system corresponding to the semiconductor system according to the first embodiment of the invention shown in FIG. 1. Namely, as is shown in FIG. 26, in addition to the foregoing first external connection terminal tm1 (P) to fifth external connection terminal tm5 (U) and first auxiliary terminal ts1 (T1P) to eleventh auxiliary terminals ts11 (TH1) shown in FIG. 1, auxiliary terminal holes 31 can be formed in a region where auxiliary terminals can be formed. In this case, it becomes possible that the positions of the auxiliary terminals are changed or added according to the specification of a user, by which a semiconductor system can be provided with high general versatility.

Figure 27:
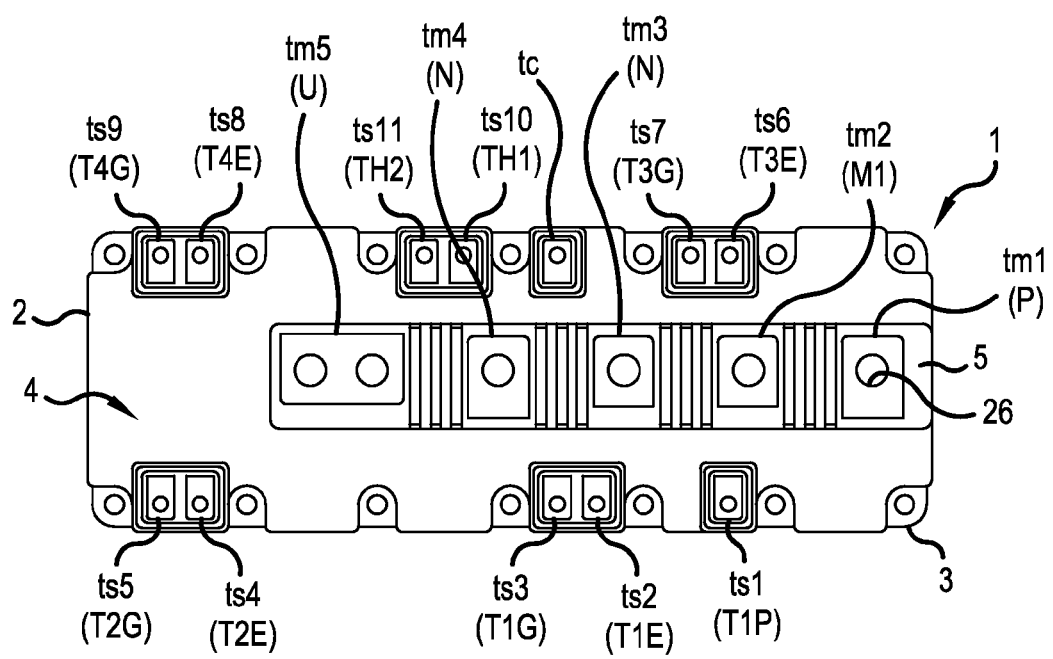
FIG. 27 is a plan view showing an example of further another modification of the semiconductor system corresponding to the semiconductor system according to the first embodiment of the invention shown in FIG. 1.

In addition, each of the foregoing first to fourth embodiments, the case is explained in which the three-level electric power inverter circuit has the configuration shown in (a) of FIG. 12 or (a) of FIG. 13. The invention, however, is not limited to this. Namely, to the invention, a three-level electric power inverter circuit can be also applied in which a bidirectional switching device is formed by connecting two insulated gate bipolar transistors, each with a diode connected in inverse parallel thereto, in series with their respective collectors connected to each other as is described in the foregoing JP-A-2011-193646. In this case, as is described in JP-A-2011-193646, an intermediate terminal must be provided at the connection point of the collectors of the insulated gate bipolar transistors for preventing damages of the insulated gate bipolar transistors due to a large electric potential difference produced in an insulation test. Thus, as is shown in FIG. 27, a plan view showing an example of further another modification of the semiconductor system corresponding to the semiconductor system according to the first embodiment of the invention shown in FIG. 1, an intermediate terminal tc is arranged on the terminal arranging surface 4 of the case 2.

In the invention, required circuit configurations can be obtained only by combining terminal connections of semiconductor modules. Therefore, the invention is not limited to the application to the semiconductor system in the foregoing power conditioning subsystem (PCS) but can be applied to semiconductor systems in the other systems such as uninterruptible power supplies (UPS), any other electric power inverters and switching ICs for high frequency uses.

While the present invention has been particularly shown and described with reference to the preferred embodiment thereof, it will be understood by those skilled in the art that the foregoing and other changes in form and details can be made therein without departing from the spirit and scope of the present invention.

This application is based on, and claims priority to, Japanese Patent Application No. 2013-021848, filed on Feb. 6, 2013. The disclosure of the priority application, in its entirety, including the drawings, claims, and the specification thereof, is incorporated herein by reference.

What is claimed is:
1. A semiconductor system comprising:
a first semiconductor device, a second semiconductor device, a third semiconductor device and a fourth semiconductor device, the semiconductor devices being at least four devices forming at least one of three-level electric power inverter circuits;

a plurality of insulating substrates on each of which at least one each of the first semiconductor device to the fourth semiconductor devices is mounted; and a base plate on the surface of which a plurality of the insulating substrates are arranged, wherein the surface of the base plate on which a plurality of the insulating substrates are arranged has four regions established into which the surface is divided in grid-like, wherein a plurality of the insulating substrates are arranged so that at least one each of the first semiconductor devices to the fourth semiconductor devices is arranged in each of the four regions to thereby disperse heat generated in the first to fourth semiconductor devices, wherein the three-level electric power inverter circuit formed on a plurality of the insulating substrates arranged on the surface of the base plate comprises:

a first insulated gate bipolar transistor as the first semiconductor device the collector of which is connected to a positive side potential of a direct current circuit;

a second insulated gate bipolar transistor as the second semiconductor device the emitter of which is connected to a negative side potential of the direct current circuit and the collector of which is connected to the emitter of the first insulated gate bipolar transistor;

a bidirectional switching device one end of which is connected to the connection point of the emitter of the first insulated gate bipolar transistor and the collector of the second insulated gate bipolar transistor:

a first external connection terminal connected to the collector of the first insulated gate bipolar transistor for connecting the collector to the positive side electric potential of the direct current circuit;

a second external connection terminal connected to the other end of the bidirectional switching device:

a third external connection terminal connected to the second external connection terminal to be at the same potential as the potential thereof;

a fourth external connection terminal connected to the emitter of the second insulated gate bipolar transistor for connecting the emitter to the negative side electric potential of the direct current circuit: and a fifth external connection terminal connected to the connection point of the emitter of the first insulated gate bipolar transistor and the collector of the second insulated gate bipolar transistor, and wherein the three-level electric power inverter circuit formed on a plurality of the insulating substrates arranged on the surface of the base plate further comprises a case of a mold of resin covering the base plate from which case the first external connection terminal, second external connection terminal, third external connection terminal, fourth external connection terminal and fifth external connection terminal are drawn out while being arranged in a straight line in the longitudinal direction, the case comprising:

a pair of auxiliary terminals for the gate and emitter, respectively, of the first insulated gate bipolar transistor arranged on one of the opposing two sides of the case with the first to the fifth external connection terminals arranged in a straight line put in between;

a pair of auxiliary terminals for the gate and emitter, respectively, of the second insulated gate bipolar transistor arranged on the one of the opposing two sides;

a pair of auxiliary terminals for the gate and emitter, respectively, of the third insulated gate bipolar transistor arranged on the other one of the opposing two sides; and a pair of auxiliary terminals for the gate and emitter, respectively, of the fourth insulated gate bipolar transistor arranged on the other one of the opposing two sides, a pair of the auxiliary terminals for the gate and emitter of the third insulated gate bipolar transistor and a pair of the auxiliary terminals for the gate and emitter of the fourth insulated gate bipolar transistor being arranged at specified positions regardless of the connections and the arrangements of the semiconductor devices of the three-level electric power inverter circuits.

2. The semiconductor system as claimed in claim 1 wherein a plurality of the insulating substrates include at least one of first insulating substrates that mounts two of the first to fourth semiconductor devices and at least one of second insulating substrates that mounts the rest two of the first to fourth semiconductor devices, the at least one of the first insulating substrates and the at least one of the second insulating substrates being arranged so that at least one of the respective ones of the first to fourth semiconductor devices is arranged in each of the four regions.

3. The semiconductor system as claimed in claim 1 wherein of the four regions, in each of two regions positioned diagonally from each other, at least one semiconductor device is arranged that generates heat with the same timing as that of the other.

4. The semiconductor system as claimed in claim 1 wherein of the four regions, in each of two regions adjacent to each other, at least one semiconductor device is arranged that generates heat with the same timing as that of the other.

5. The semiconductor system as claimed in claim 1 wherein the bidirectional switching device is formed of two reverse blocking insulated gate bipolar transistors as the third and fourth semiconductor devices connected in inverse parallel to each other.

6. A semiconductor system comprising:

a first semiconductor device, a second semiconductor device, a third semiconductor device and a fourth semiconductor device, the semiconductor devices being at least four devices forming at least one of three-level electric power inverter circuits;

a plurality of insulating substrates on each of which at least one each of the first semiconductor device to the fourth semiconductor devices is mounted; and a base plate on the surface of which a plurality of the insulating substrates are arranged, wherein the surface of the base plate on which a plurality of the insulating substrates are arranged has four regions established into which the surface is divided in grid-like, wherein a plurality of the insulating substrates are arranged so that at least one each of the first semiconductor devices to the fourth semiconductor devices is arranged in each of the four regions to thereby disperse heat generated in the first to fourth semiconductor devices, and wherein the three-level electric power inverter circuit formed on a plurality of the insulating substrates arranged on the surface of the base plate comprises:

a first insulated gate bipolar transistor as the first semiconductor device the collector of which is connected to a positive side potential of a direct current circuit;

a second insulated gate bipolar transistor as the second semiconductor device the emitter of which is connected to an negative side potential of the direct current circuit;

a third insulated gate bipolar transistor as the third semiconductor device the emitter of which is connected to the collector of the second insulated gate bipolar transistor;

a fourth insulated gate bipolar transistor as the fourth semiconductor device the collector of which is connected to the emitter of the first insulated gate bipolar transistor and the emitter of which is connected to the collector of the third insulated gate bipolar transistor;

a series connection of a first diode and a second diode the anode side of which connection is connected to the connection point of the collector of the second insulated gate bipolar transistor and the emitter of the third insulated gate bipolar transistor and the cathode side of which connection is connected to the connection point of the emitter of the first insulated gate bipolar transistor and the collector of the fourth insulated gate bipolar transistor;

a first external connection terminal connected to the collector of the first insulated gate bipolar transistor for connecting the collector to the positive side electric potential of the direct current circuit;

a second external connection terminal connected to the connection point of the first and second diodes;

a third external connection terminal connected to the second external connection terminal to be at the same potential as the potential thereof;

a fourth external connection terminal connected to the emitter of the second insulated gate bipolar transistor for connecting the emitter to the negative side electric potential of the direct current circuit; and a fifth external connection terminal connected to the connection point of the emitter of the fourth insulated gate bipolar transistor and the collector of the third insulated gate bipolar transistor.

7. The semiconductor system as claimed in claim 1 wherein the case has a plurality of auxiliary terminal holes arranged at a plurality of positions so that a pair of the auxiliary terminals for the gate and emitter of the first insulated gate bipolar transistor to a pair of the auxiliary terminals for the gate and emitter of the second insulated gate bipolar transistor are drawn out from the case while being chosen according to the connections and the arrangements of the semiconductor devices of the three-level electric power inverter circuits.

* * * * *